US012575337B2

(12) United States Patent
Woo et al.

(10) Patent No.: US 12,575,337 B2
(45) Date of Patent: Mar. 10, 2026

(54) OXIDE ELECTRODE-BASED 3-TERMINAL NEUROMORPHIC SYNAPTIC DEVICE CONTAINING MOBILE IONS, AND METHOD OF MANUFACTURING THE SAME

(71) Applicant: Kyungpook National University Industry-Academic Cooperation Foundation, Daegu (KR)

(72) Inventors: Jiyong Woo, Daegu (KR); Heebum Kang, Daegu (KR)

(73) Assignee: Kyungpook National University Industry-Academic Cooperation Foundation, Daegu (KR)

( * ) Notice: Subject to any disclaimer, the term of this patent is extended or adjusted under 35 U.S.C. 154(b) by 405 days.

(21) Appl. No.: 18/122,696

(22) Filed: Mar. 16, 2023

(65) Prior Publication Data

US 2023/0301211 A1      Sep. 21, 2023

(30) Foreign Application Priority Data

Mar. 21, 2022      (KR) ......................... 10-2022-0034647

(51) Int. Cl.
*H10N 70/20*      (2023.01)
*G06N 3/065*      (2023.01)
*H10N 70/00*      (2023.01)

(52) U.S. Cl.
CPC ........... *H10N 70/253* (2023.02); *G06N 3/065* (2023.01); *H10N 70/021* (2023.02);
(Continued)

(58) Field of Classification Search
CPC ........... H10N 70/20; H10N 70/24–253; H10N 70/801; H10N 70/821–826; H10N 70/8416; G06N 3/065
See application file for complete search history.

(56) References Cited

U.S. PATENT DOCUMENTS 10,957,937 B2      3/2021  Todorov et al.
12,284,923 B2 *    4/2025  Woo ..................... H10N 70/011
(Continued)

FOREIGN PATENT DOCUMENTS

KR      10-2018-0057384 A      5/2018
KR      10-2020-0115722 A      10/2020
(Continued)

OTHER PUBLICATIONS

Tsuyoshi Hasegawa, et al., "Volatile/Nonvolatile Dual-Functional Atom Transistor", Applied Physics Express, Jan. 2011, 4pages.

*Primary Examiner* — Khaja Ahmad
*Assistant Examiner* — Candice Chan
(74) *Attorney, Agent, or Firm* — Park, Kim & Suh, LLC

(57) ABSTRACT

Disclosed is a 3-terminal neuromorphic synaptic device including a substrate, a source electrode and a drain electrode provided on the substrate to be spaced apart from each other, a channel area provided on the substrate to be electrically connected to the source electrode and the drain electrode, between the source electrode and the drain electrode, an ion transport layer provided on the channel area, a gate electrode provided on the ion transport layer, and a voltage application part that applies a gate voltage to the gate electrode. The gate electrode is formed of at least one of an oxide-based material including mobile ions, a chalcogenide-based material including the mobile ions, and a nitride-based material including the mobile ions.

6 Claims, 23 Drawing Sheets

10

(52) U.S. Cl.
 CPC ......... *H10N 70/245* (2023.02); *H10N 70/821*
  (2023.02); *H10N 70/8416* (2023.02)

(56) References Cited

U.S. PATENT DOCUMENTS

| | | | |
|---|---|---|---|
| 2017/0104031 A1* | 4/2017 | Clark ..................... | H10B 63/20 |
| 2020/0279154 A1* | 9/2020 | Todorov .............. | H10N 70/841 |
| 2021/0125043 A1* | 4/2021 | Bragaglia .......... | G11C 13/0009 |
| 2021/0265564 A1* | 8/2021 | Ge ........................ | H10N 70/24 |

FOREIGN PATENT DOCUMENTS

| | | | |
|---|---|---|---|
| KR | 10-2021-0092181 A | 7/2021 | |
| KR | 10-2274813 B1 | 7/2021 | |
| KR | 10-2493039 B1 | 1/2023 | |

* cited by examiner

1

OXIDE ELECTRODE-BASED 3-TERMINAL NEUROMORPHIC SYNAPTIC DEVICE CONTAINING MOBILE IONS, AND METHOD OF MANUFACTURING THE SAME

CROSS-REFERENCE TO RELATED APPLICATIONS

This application claims priority under 35 U.S.C. § 119 to Korean Patent Application No. 10-2022-0034647 filed on Mar. 21, 2022, in the Korean Intellectual Property Office, the disclosures of which are incorporated by reference herein in their entireties.

BACKGROUND

Embodiments of the present disclosure described herein relate to an oxide electrode-based 3-terminal neuromorphic synaptic device containing mobile ions, and a method of manufacturing the same.

A neuromorphic system may be implemented by using a principle of neural cells. A neuromorphic system refers to a system that simulates processing of data by a brain of a human being by implementing neurons that constitute the brain by using a plurality of devices (or elements). Accordingly, data may be processed and learned in a similar manner to that of a brain by using the neuromorphic system including neuron devices. That is, the neural device may be connected to a third neural device through synapses of the neural device, and may receive data from the third neural device through the synapses.

Then, the neural device stores and integrates the received data, and may utter and output them in the case of a threshold voltage or more. That is, the neural device functions to accumulate and utter the data. Furthermore, the neuromorphic synaptic device augments or restrains the input data, and then delivers them to neural devices. That is, the neuromorphic synaptic device selectively outputs data according to an input voltage.

Meanwhile, to increase a recognition preciseness of the neuromorphic system, neuromorphic synaptic devices that store analog information as compared with a digital memory that distinguishes only 0 and 1 is necessary. In particular, a high preciseness of a human level may be secured when analog information linearly increases according to the number of applications of voltages. However, a conventional transistor-based synaptic device has a limitation in obtaining linear channel current change characteristics according to the number of applications of voltages.

Furthermore, it is difficult for the conventional neuromorphic synaptic device to secure more multilevel states due to a limitation in a change width of currents. That is, conventionally, as the gate voltage is repeatedly applied, for example, only five multilevel states corresponding to 0 to 4 (0, 1, 2, 3, and 4) may be obtained, and there is a technical limitation in expanding the multilevel states further.

SUMMARY

An aspect of the present disclosure provides an oxide electrode-based 3-terminal neuromorphic synaptic device and a method for manufacturing the same, by which a conductance of a device may be linearly controlled by adjusting a mass ratio of mobile ions in an oxide electrode containing mobile ions.

Meanwhile, the technical objectives that are to be achieved in the present disclosure are not limited to the above-mentioned technical objectives, and other technical objectives may be clearly understood by an ordinary person in the art, to which the present disclosure pertains, from the following description.

According to an aspect of the present disclosure, a 3-terminal neuromorphic synaptic device includes a substrate, a source electrode and a drain electrode provided on the substrate to be spaced apart from each other, a channel area provided on the substrate to be electrically connected to the source electrode and the drain electrode, between the source electrode and the drain electrode, an ion transport layer provided on the channel area, a gate electrode provided on the ion transport layer, and a voltage application part that applies a gate voltage to the gate electrode, and the gate electrode is formed of at least one of an oxide-based material including mobile ions, a chalcogenide-based material including the mobile ions, and a nitride-based material including the mobile ions.

The mobile ions may be copper ions, and a mass ratio of the copper ions in the gate electrode may be more than 84.2% and less than 93.7%.

The ion transport layer may have a thickness of more than 20 nanometers and less than 30 nanometers.

The gate electrode may include a second gate electrode laminated on the ion transport layer, and a first gate electrode laminated on the second gate electrode, and a mass ratio of the mobile ions included in the first gate electrode may be higher than a mass ratio of the mobile ions included in the second gate electrode.

The gate electrode may further include a third gate electrode laminated on the first gate electrode, and a mass ratio of the mobile ions included in the third gate electrode may be higher than the mass ratio of the mobile ions included in the first gate electrode.

The ion transport layer may include a first ion transport layer provided on a bottom surface of the gate electrode, and a second ion transport layer that is surrounded by the gate electrode.

A barrier layer may be provided between the ion transport layer and the gate electrode, and the barrier layer includes Ti, Ta, TiW, or TiN.

According to another aspect of the present disclosure, a method of manufacturing a 3-terminal neuromorphic synaptic device includes forming a channel area, a source electrode, and a drain electrode on a substrate, forming an ion transport layer on the channel area, forming a gate electrode, to which a gate voltage is to be applied, on the ion transport layer, and forming a voltage application part that applies the gate voltage to the gate electrode, the gate electrode is formed of at least one of an oxide-based material including mobile ions, a chalcogenide-based material including the mobile ions, and a nitride-based material including the mobile ions.

The mobile ions may be copper ions, and the forming of the ion transport layer may be performed in a condition, a mass ratio of oxygen to argon is more than 1/29 to 5/25.

The forming of the ion transport layer may be performed under a pressure of more than 4 millitorr and less than 6 millitorr.

BRIEF DESCRIPTION OF THE FIGURES

The above and other objects and features of the present disclosure will become apparent by describing in detail embodiments thereof with reference to the accompanying drawings.

DETAILED DESCRIPTION

Other advantages and features of the present disclosure, and methods for achieving them will become clear with reference to the embodiments that will be described in detail together with the accompanying drawings. However, the present disclosure is not limited by the embodiments disclosed hereinafter but may be implemented in various different forms, and the embodiments are provided simply to make the disclosure of the present disclosure complete and fully inform an ordinary person in the art, to which the present disclosure pertains, of ranges of the present disclosure, and the present disclosure is defined only by the ranges of the claims.

Although not defined, all the terms (including technical or scientific terms) used here have the same meanings as those generally accepted by general technologies in the conventional technology, to which the present disclosure pertains.

The terms defined by general dictionaries may be construed to have the same meanings as those in the related technologies and/or the contexts of the application, and will neither become conceptual nor be construed excessively formally even though they are not expressions defined explicitly here.

The terms used in the specification is for describing the embodiments, and are not intended to limit the present disclosure. In the specification, singular forms include plural forms unless particularly mentioned in the contexts.

An expression of 'including or comprising" and/or various used conjugations of the verb, for example, 'include or comprise', 'includes or comprises', which are used in the specification, do not exclude, in addition to compositions, ingredients, components, steps, operations, and/or devices, which are mentioned, presence or addition of one or more other compositions, ingredients, components, steps, operations, and/or devices. The term of 'and/or' in the specification means each of or various combinations of listed configurations.

Hereinafter, embodiments of the present disclosure will be described in detail with reference to the accompanying drawings of the specification.

Figure 1:
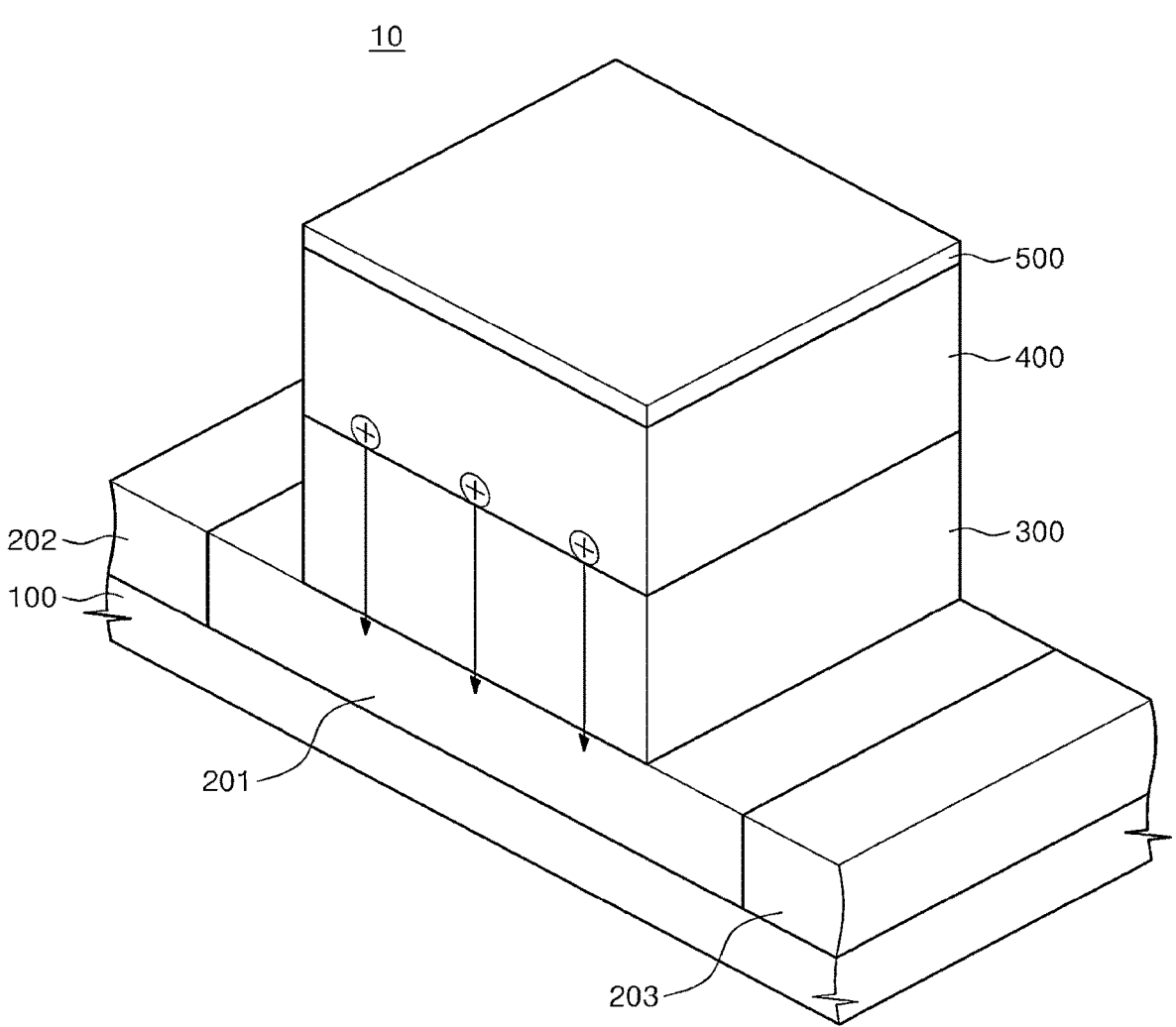
FIG. 1 is a view schematically illustrating a configuration of a 3-terminal neuromorphic synaptic device 10 according to an embodiment of the present disclosure.

FIG. 1 is a view schematically illustrating a configuration of a 3-terminal neuromorphic synaptic device 10 according to an embodiment of the present disclosure.

Referring to FIG. 1, the 3-terminal neuromorphic synaptic device 10 may include a substrate 100, a channel area 201, a source electrode 202, a drain electrode 203, an ion transport layer 300, a gate electrode 400, and a voltage application part (not illustrated).

The source electrode 202 and the drain electrode 203 may be provided on the substrate 100 to be spaced apart from each other.

The substrate may be a silicon substrate, a silicon-on-insulator (SOI) substrate, a germanium substrate, a germanium-on-insulator (GOI) substrate, a silicon-germanium substrate, a TiN substrate, a tungsten substrate, and the like, but the present disclosure is not limited thereto.

According to an example, the substrate 100 may be SiO$_2$ of a thickness of 100 [nm].

In an exemplary embodiment, the substrate may be a p type semiconductor substrate doped with p type impurities or an n type semiconductor substrate doped with n type impurities.

In an embodiment, the substrate 100 and the source electrode 202 may be electrically connected to a ground.

The channel area 201 may be provided on the substrate to be electrically connected to the source electrode 202 and the drain electrode 203, between the source electrode 202 and the drain electrode 203.

In an embodiment, the source electrode 202 and/or the drain electrode 203 may be formed of one or more metallic materials selected from tungsten, aluminum, copper, nickel, iron, chrome, titanium, zinc, lead, god, and silver. The source electrode 202 and/or the drain electrode 203 may include a conductive polymeric material or a doped polymeric material.

According to an embodiment, the source electrode 202 and/or the drain electrode 203 may be electrodes that are formed on opposite sides of the channel area 201 by using tungsten (W).

The channel area 201 functions to accumulate mobile ions that start from the gate electrode 400, pass through the ion transport layer 300, and reach the channel area 201. The channel area 201 may be formed on the substrate through various deposition methods.

In an embodiment, the channel area 201 may include any one of materials formed of a small-molecular organic semiconductor, an organic semiconductor, a conductive polymer, an inorganic semiconductor, an oxide semiconductor, a two-dimensional semiconductor, and quantum dots.

The channel area 201 may include any one material selected from W, Co, Mo, Ti, and Ta. The channel area 201 may be formed of a metal oxide, such as $WO_3$ and $TiO_2$, atoms of which may be changed, a chalcogenide-based material, and a metallic material, but the present disclosure is not limited thereto and the channel area 201 may be formed of various materials, conductance of which are changed by mobile ions.

According to an embodiment, the channel area 201 may be a $WO_x$ layer of a thickness of 20 [nm] that is formed by applying an output capacity of 50 [W] to an argon (Ar) gas to form a plasma state, and applying an RF sputtering technique.

The ion transport layer 300 may be provided in a partial area on the channel area 201. The ion transport layer 300 may transport the mobile ions extracted from the gate electrode 400, between the gate electrode 400 and the channel area 201, according to a gate voltage applied to the gate electrode 400.

In an embodiment, the ion transport layer 300 may include an electrolytic material that causes the mobile ions formed in the gate electrode 400 to travel to the channel area 201 or causes the mobile ions that traveled to the channel area 201 to travel to the gate electrode 400 again according to the gate voltage applied to the gate electrode 400.

The ion transport layer 300 may have synaptic characteristics because it includes ionic materials. That is, a synaptic stimulation spike generates an excitatory post-synaptic current (that is, an inter-source/drain current) by causing the mobile ions to travel toward the channel area 201 formed on a lower side of the ion transport layer 300. Then, the channel area 201 accumulates the mobile ions that traveled to the channel area 100.

The mobile ions that pass through the ion transport layer 300 may include positive ions, such as $Cu^+$, $H^+$, $LI^+$, $Na^+$, and $Ag+$, or negative ions, such as $O^{2-}$. The ion transport layer 300 may include an electrolytic material, such as $HfO_x$, $SiO_2$, $MoO_3$, which transport Cu ion particularly.

Hereinafter, an example of the ion transport layer 300 being $HfO_x$ will be described.

According to an example, the ion transport layer 300 may be a layer that is formed by applying an output capacity of 100 [W] to an argon (Ar) gas to form a plasma state, and then applying an RF sputtering technique to deposit a $HfO_x$ layer.

The gate electrode 400 may include the mobile ions, and may be provided on the ion transport layer 300.

The mobile ions included in the gate electrode 400 may include any one material selected from copper, tungsten, hafnium, zirconium, titanium, tantalum, aluminum, ruthenium, palladium, platinum, cobalt, nickel and a conductive metal nitride, or a combination thereof.

In an embodiment, the gate electrode 400 may be formed of at least one of an oxide-based material including the mobile ions, a chalcogenide-based material including mobile ions, and a nitride-based material including the mobile ions.

When the mobile ions are copper (Cu) ions and the gate electrode 400 is oxide-based, the gate electrode 400 may be formed of $CuO_x$ and $CuO_xN_y$.

When the mobile ions are copper (Cu) ions and the gate electrode 400 is chalcogenide-based, the gate electrode 400 may be formed of at least one of CuGe, CuSe, and CuGeSe.

When the mobile ions are copper (Cu) ions and the gate electrode 400 is nitride-based, the gate electrode 400 may be formed of $C_uN_x$.

Hereinafter, an example of the mobile ions being $CuO_x$ that is an oxide-based material in the gate electrode 400 will be described. In this case, the gate electrode 400 may be formed by depositing a Cu metal target and plasma of an argon (Ar) gas and an oxygen ($O_2$) gas on the ion transport layer 300 through reactive sputtering.

Then, a composition ratio of Cu and O may be controlled by adjusting a ratio of an argon (Ar) gas and an oxygen ($O_2$) gas in a deposition process through the reactive sputtering.

In more detail, when a concentration of the argon gas is higher than a concentration of the oxygen gas in the reactive sputtering process, among copper (Cu) and oxygen ($O_2$) that constitute the gate electrode 400, a ratio of copper becomes higher, and when a concentration of the oxygen gas is higher than a concentration of the argon gas in the reactive sputtering process to the contrary, among copper (Cu) and oxygen ($O_2$) that constitute the gate electrode 400, a ratio of oxygen becomes higher.

When a voltage is applied to the gate electrode 400, the mobile ions discharged from the gate electrode 400 by the applied voltage travels to the channel area 201 via the ion transport layer 300, and thus an amount of the mobile ions in the channel area 201 is changed and a conductivity of the channel area 201 also is changed whereby the mobile ions have depression characteristics and potentiation characteristics that are synaptic characteristics.

The voltage application part (not illustrated) may be configured to apply a drain voltage to the drain electrode 203 and apply a gate voltage to the gate electrode 400. The voltage application part may adjust a resistance and a conductance of the channel area 201 by changing the amount of the mobile ions accumulated in the channel area 201 according to the number of applications of the gate voltage.

A capping layer 500 may be additionally provided at an upper end of the gate electrode 400, and the capping layer 500 may include any one material selected from copper, tungsten, hafnium, zirconium, titanium, tantalum, aluminum, ruthenium, palladium, platinum, cobalt, nickel and a conductive metal nitride, or a combination thereof.

Figure 2:
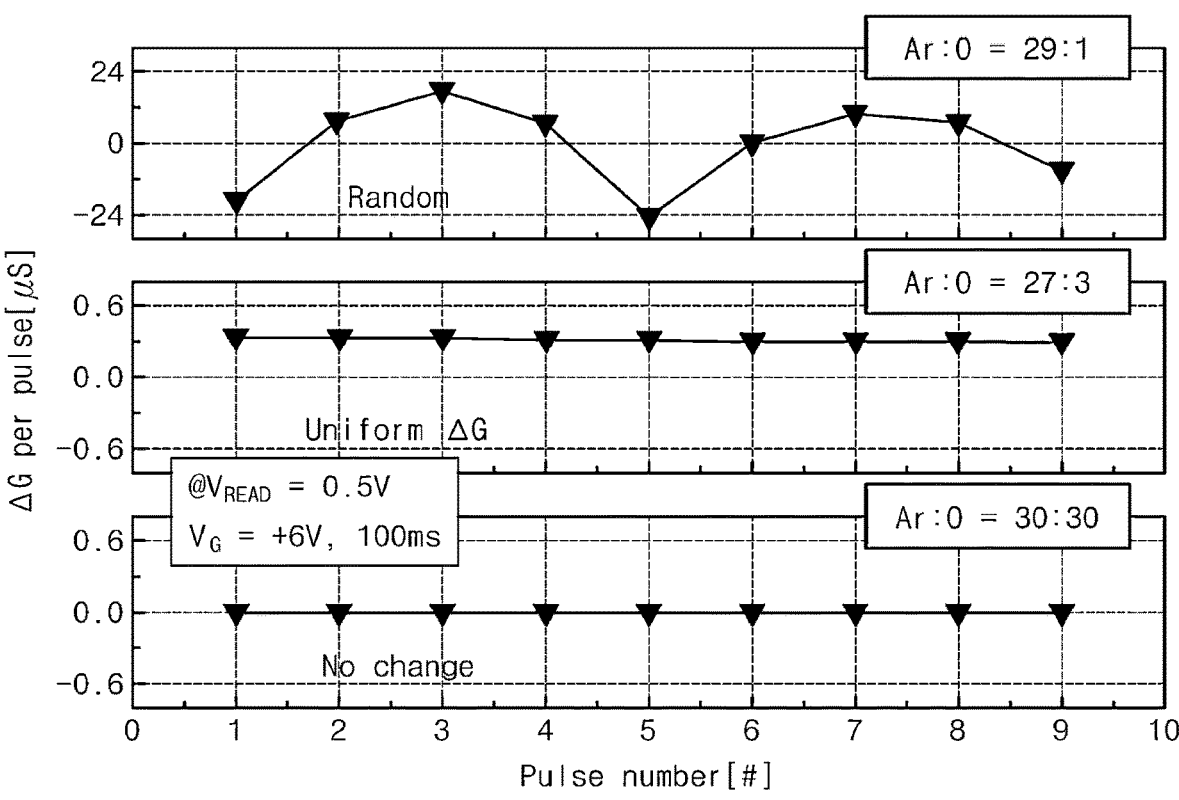
FIG. 2 is a graph depicting a change in a capacitance of a neuromorphic synaptic device 10 according to a ratio of an argon gas to an oxygen gas when a gate electrode 400 is formed.

FIG. 2 is a graph depicting a change in a capacitance of a neuromorphic synaptic device 10 according to a ratio of an argon gas to an oxygen gas when the gate electrode 400 is formed;

FIG. 2 illustrates graphs depicting changes of a conductance of the neuromorphic synaptic device 10 as pulses are applied to the gate electrode 400 after the gate electrode 400 is generated, in which a ratio of the argon gas and the oxygen gas is 29:1 in a graph at an uppermost end, a ratio of the argon gas and the oxygen gas is 27:3 in a middle graph, and a ratio of the argon gas and the oxygen gas is 30:30 in a graph at a lowermost end.

It was observed that when the ratio of the argon gas and the oxygen gas was 29:1, a change in the conductance was changed at random (both of positive values and negative values were observed) as the pulses are applied, when the ratio was 27:3, a constant change in the conductance was shown, and when the ratio was 30:30, the change in the conductance converged to 0.

As described above in FIG. 1, a ratio of the copper ions and the oxygen ions that constitute the gate electrode 400 may be adjusted by adjusting the ratio of the argon gas and the oxygen gas.

Then, bonding of the copper ions to the oxygen ions becomes weaker as the ratio of the copper ions that constitutes the gate electrode 400 becomes higher, and this means that the copper ions easily travels to the channel area 201 via the ion transport layer 300 when the gate voltage is applied. In this case, as in the graph of the uppermost end of FIG. 2, it becomes difficult to control the change in the conductance for the channel area 201.

In contrast, bonding of the copper ions to the oxygen ions becomes stronger as the ratio of the copper ions that constitutes the gate electrode 400 becomes lower, and this means that it becomes difficult for the copper ions to travel to the channel area 201 when the gate voltage is applied. This restrains the change in the conductance even when a voltage is applied to the gate electrode 400 as in the graph of the lowermost end of FIG. 2.

That is, it may be experimentally seen that it is preferable that the ratio of the argon gas and the oxygen gas is a value between 30:30 and 29:1 when the gate electrode 400 is formed, and in particular, that it is most preferable that the ratio is 27:3.

The ratio of the mobile ions included in the gate electrode 400 varies according to the ratio of the argon gas and the oxygen gas when the gate electrode 400 is formed. Accordingly, when the mobile ions are copper ions, a mass ratio occupied by the copper ions in the gate electrode 400 may be obtained according to the ratio of the argon as and the oxygen gas.

For example, the mass ratio occupied by the copper ions in the gate electrode 400 may be 93.7% when the ratio of the argon gas and the oxygen gas is 29:1, the mass ratio occupied by the copper ions in the gate electrode 400 may be 84.9% when the ratio of the argon gas and the oxygen gas is 27:3, the mass ratio occupied by the copper ions in the gate electrode 400 may be 84.2% when the ratio of the argon gas and the oxygen gas is 25:5, and the mass ratio occupied by the copper ions in the gate electrode 400 may be 83.4% when the ratio of the argon gas and the oxygen gas is 30:30.

Accordingly, it may be preferable that the mass ratio of the copper ions included in the gate electrode 400 is more than 84.2% that is the mass ratio when the ratio of the argon gas and the oxygen gas is 25:5, and the mass ratio is less than 93.7% that is the mass ratio when the ratio of the argon gas and the oxygen gas is 29:1.

Figure 3:
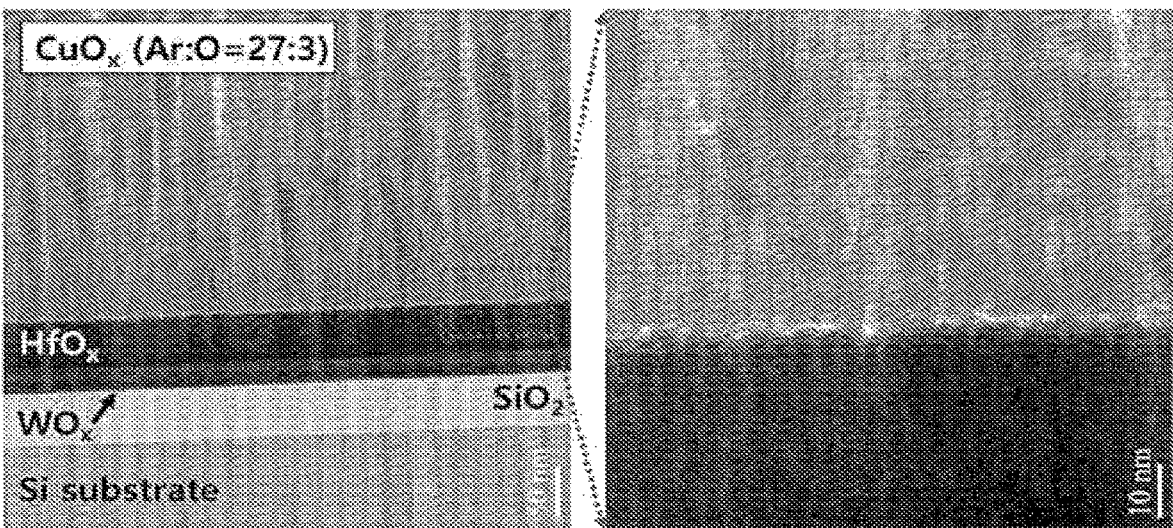
FIG. 3 is a view illustrating an image in a condition, in which a ratio of an argon gas and a ratio of an oxygen gas is 27:3 when a gate electrode 400 is formed.

FIG. 3 is a view illustrating an image in a condition, in which the ratio of the argon gas and the ratio of an oxygen gas is 27:3 when the gate electrode 400 is formed;

Referring to FIG. 3, it was observed that a layer was formed between a $CuO_x$ layer corresponding to the gate electrode 400 and a $HfO_x$ layer corresponding to the ion transport layer 300. It may be seen that an amount of the layer was increased as the ratio of the oxygen gas becomes higher, and this acts as one of the reasons that decrease the change in the conductance when the ratio of the oxygen gas to the argon gas becomes higher.

Figure 4:
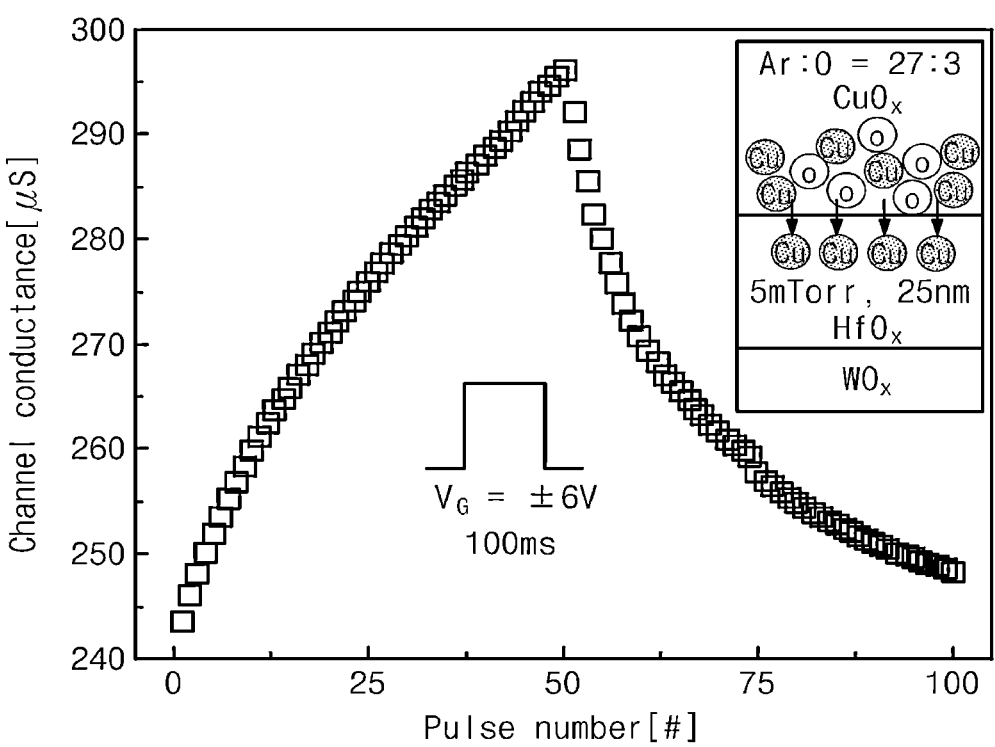
FIG. 4 is a graph depicting a change of a conductance as pulses are applied to a gate electrode 400 after a gate electrode 400 is formed while a ratio of an argon gas and an oxygen gas is 27:3.

FIG. 4 is a graph depicting the change of the conductance as pulses are applied to the gate electrode 400 after the gate electrode 400 is formed while the ratio of an argon gas and an oxygen gas is 27:3;

Referring to FIG. 4, it may be observed that the conductance is consistently generated as a voltage of +6 [V] is applied fifty times, and thereafter, the conductance consistently decreases as a voltage of −6 [V] is applied fifty times.

That is, it was observed that the conductance of the 3-terminal neuromorphic synaptic device 10 is normally changed when the gate electrode 400 is formed while the ratio of the argon gas and the oxygen gas is 27:3.

Figure 5:
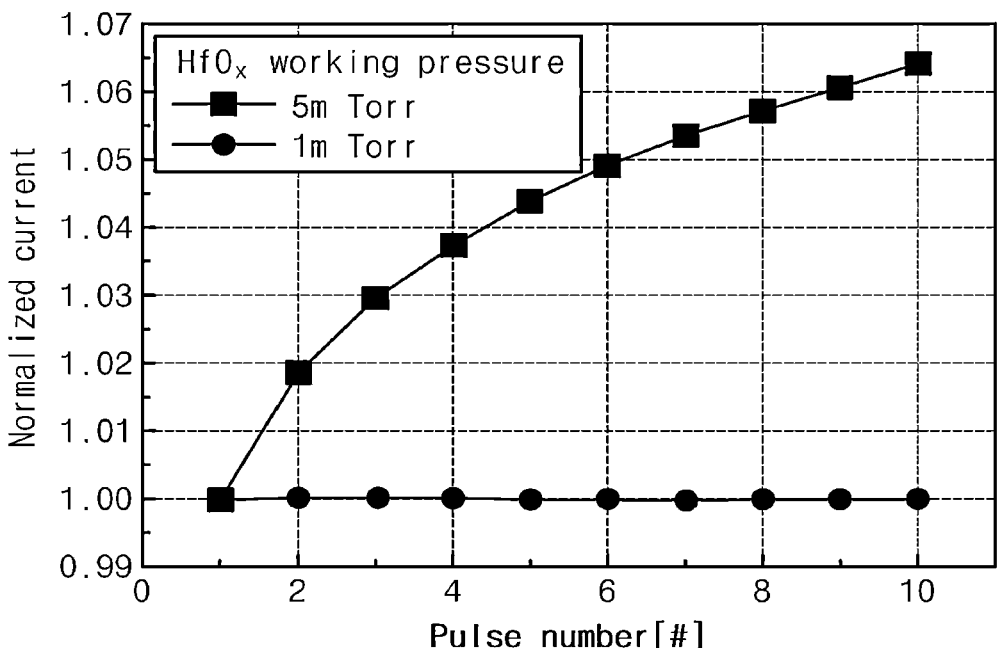
FIG. 5 is a graph depicting a change in a current in a channel area 201 according to a working pressure in a process of depositing an ion transport layer 300 by using HfO$_x$.

FIG. 5 is a graph depicting a change in a current in the channel area 201 according to a working pressure in a process of depositing the ion transport layer 300 by using $HfO_x$.

Referring to FIG. 5, it may be observed that a current gradually increases in the channel area 201 when pulses are applied to the gate electrode 400 after the ion transport layer 300 is formed by depositing $HfO_x$ under a working pressure of 5 [m][Torr].

Unlike this, no change in the current occurred even when pulses were applied when the ion transport layer 300 is formed under a working pressure of 1 [m][Torr].

This is construed that a mobility of the mobile ions decreases because a density of $HfO_x$ that constitutes the ion transport layer 300 is high under the working pressure of 1 [m][Torr].

Accordingly, it may be seen that the working pressure when the ion transport layer 300 is deposited has to be more than 1 [m][Torr], and in particular, it was observed that it was preferable that a working pressure of 5 [m][Torr] or more was provided.

Accordingly, it is considered that it is preferable that the ion transport layer 300 is deposited under a pressure of around 5 [m][Torr], for example, a pressure of more than 4 [m][Torr] and less than 6 [m][Torr] when the ion transport layer 300 is deposited.

Figure 6:
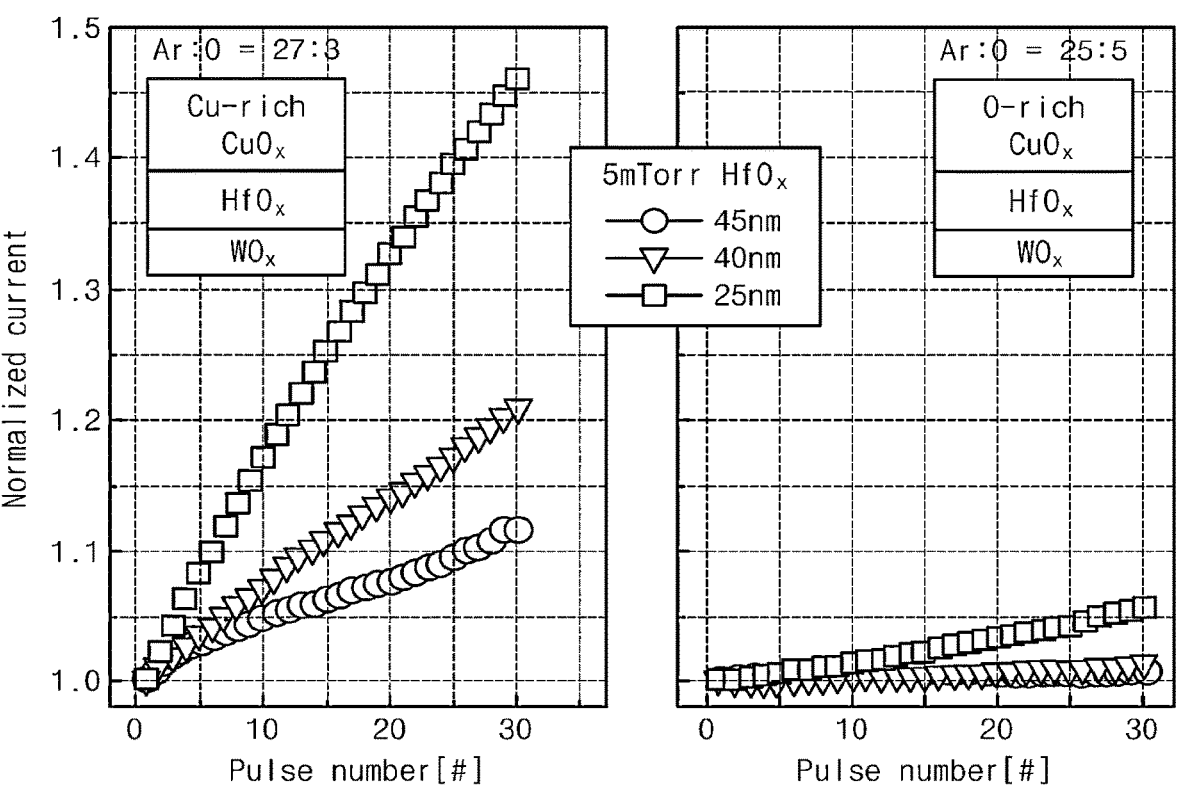
FIG. 6 is a graph depicting a change of a current according to a ratio of an argon gas and an oxygen gas and a thickness of an ion transport layer 300 when a gate electrode 400 is deposited.

FIG. 6 is a graph depicting a change of a current according to a ratio of the argon gas and the oxygen gas and a thickness of the ion transport layer 300 when the gate electrode 400 is deposited;

Referring to FIG. 6, a left graph is a graph obtained by performing an experiment under a $CuO_x$ condition, in which the ratio of copper (Cu) is higher than that of oxygen ($O_2$) in the gate electrode 400 by setting the ratio of the argon gas and the oxygen gas to 27:3 when the gate electrode 400 is deposited.

Furthermore, a right graph is a graph obtained by performing an experiment under a $CuO_x$ condition, in which the ratio of oxygen ($O_2$) is higher than that of copper (Cu) in the gate electrode 400 by setting the ratio of the argon gas and the oxygen gas to 25:5 when the gate electrode 400 is deposited.

It may be seen that a current value is largest when a thickness of the ion transport layer is 25 [nm] when a current of the channel area 201 is observed while a thickness of $HfO_x$ corresponding to the ion transport layer 300 is changed to 45 [nm], 40 [nm], and 25 [nm] in the left and right graphs, and to the contrary, it may be seen that the current value is smallest when the ion transport layer 300 is larger. In particular, it was observed that a current hardly flows when the thickness of the ion transport layer 300 is 40 [nm] or less in the right graph.

Accordingly, it may be seen that the thickness of the ion transport layer 300 has to be 40 [nm] or less when the ion transport layer 300 is deposited under a pressure of 5 [m][Torr], and in particular it was observed that 25 [nm] was preferable.

Accordingly, it is considered that it is preferable that the thickness of the ion transport layer 300 is a thickness of around 25 [nm], for example, more than 20 [nm] and less than 30 [nm].

An experiment for verifying a performance of the 3-terminal neuromorphic synaptic device 10 according to an embodiment of the present disclosure was made. The 3-terminal neuromorphic synaptic device 10 was manufactured by sequentially forming the channel area 201 formed of $WO_x$, the ion transport layer 300 formed of $HfO_x$, the gate electrode 400 formed of $CuO_x$, and the capping layer 500 formed of "W", on the $SiO_2$ substrate 100 of a thickness of 100 [nm].

The $WO_x$ channel layer was deposited on the $SiO_2$ substrate 100 through reactive sputtering by using the tungsten (W) metal target, and argon (Ar) and oxygen ($O_2$) plasma.

The source electrode and the drain electrode may be formed by depositing the tungsten "W" metal on opposite ends of the channel area 201.

The ion transport layer 300 was formed by depositing a $HfO_2$ electrolyte of 25 [nm] under a working pressure of 5 [m][Torr].

The gate electrode 400 was formed by depositing $CuO_x$ at a location of a middle part of the channel area 201. In more detail, the gate electrode 400 was deposited on the ion transport layer 300 through reactive sputtering by using copper (Cu), a metal target, argon (Ar) and oxygen ($O_2$) plasma, and the ratio of the argon and oxygen during the reactive sputtering was set to 27:3.

Figure 7:
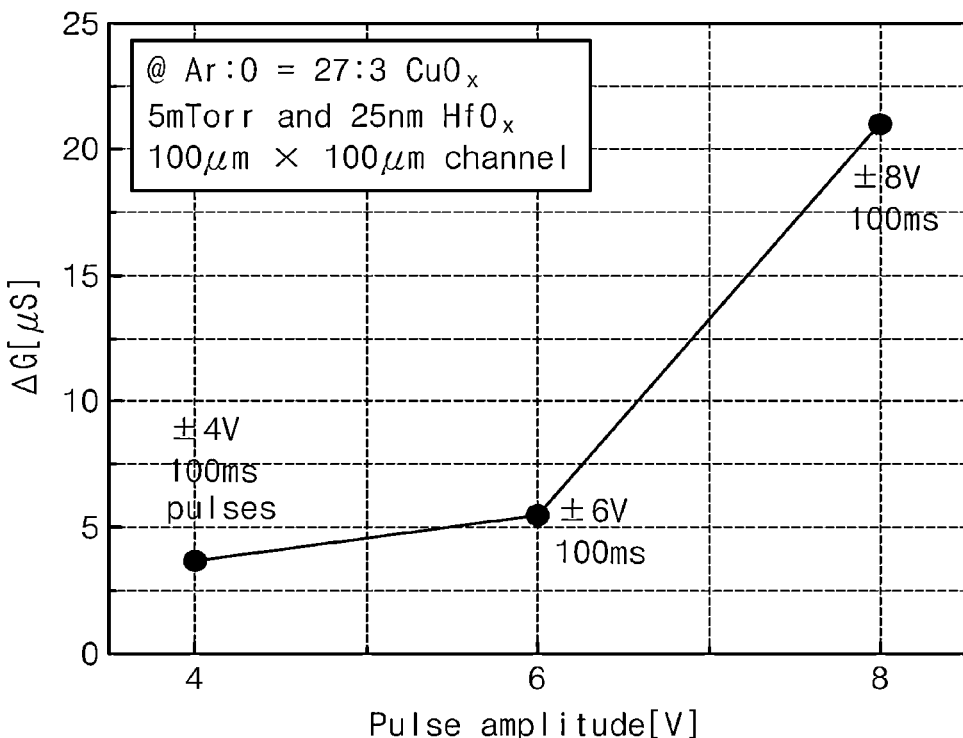
FIG. 7 is a graph depicting a change in a conductance according to magnitudes of pulses applied to a gate electrode 400.
Figure 8:
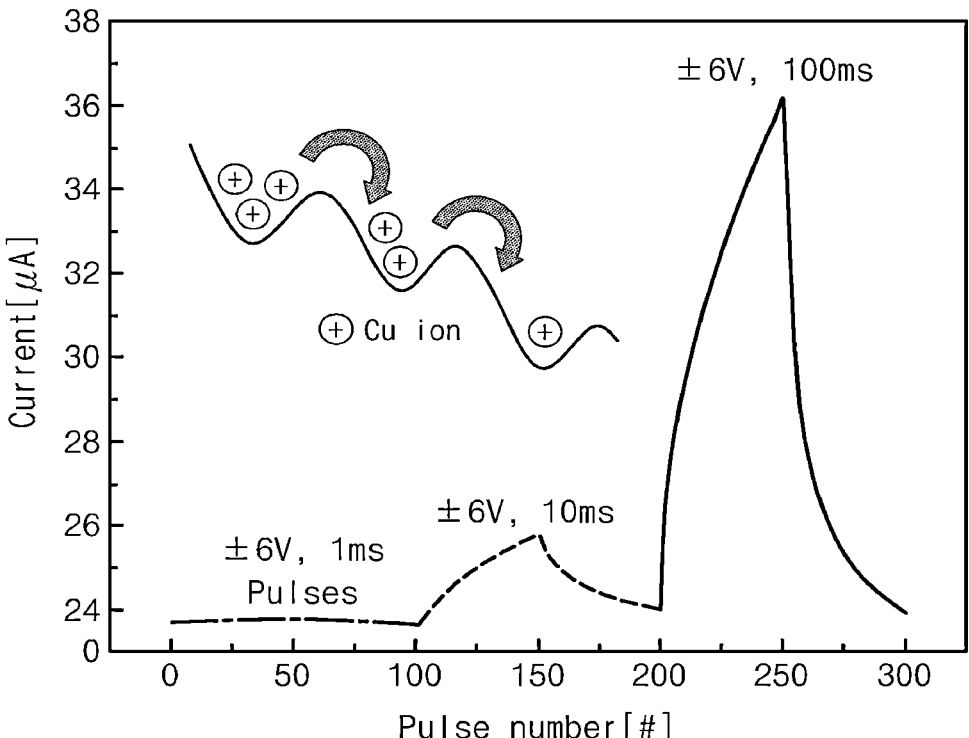
FIG. 8 is a graph depicting a change in a conductance according to time periods of pulses applied to a gate electrode 400.

FIG. 7 is a graph depicting a change in a conductance according to magnitudes of pulses applied to the gate electrode 400, and FIG. 8 is a graph depicting a change in a conductance according to time periods of pulses applied to the gate electrode 400.

Referring to FIGS. 7 and 8, it was observed that a change in a conductance became larger as a time period, for which pulses were applied, became larger when magnitudes of the pulses were larger, and it may be identified that the 3-terminal neuromorphic synaptic device 10 manufactured through the above-described method is operated as intended by the conductance as the pulses are applied.

Figure 9:
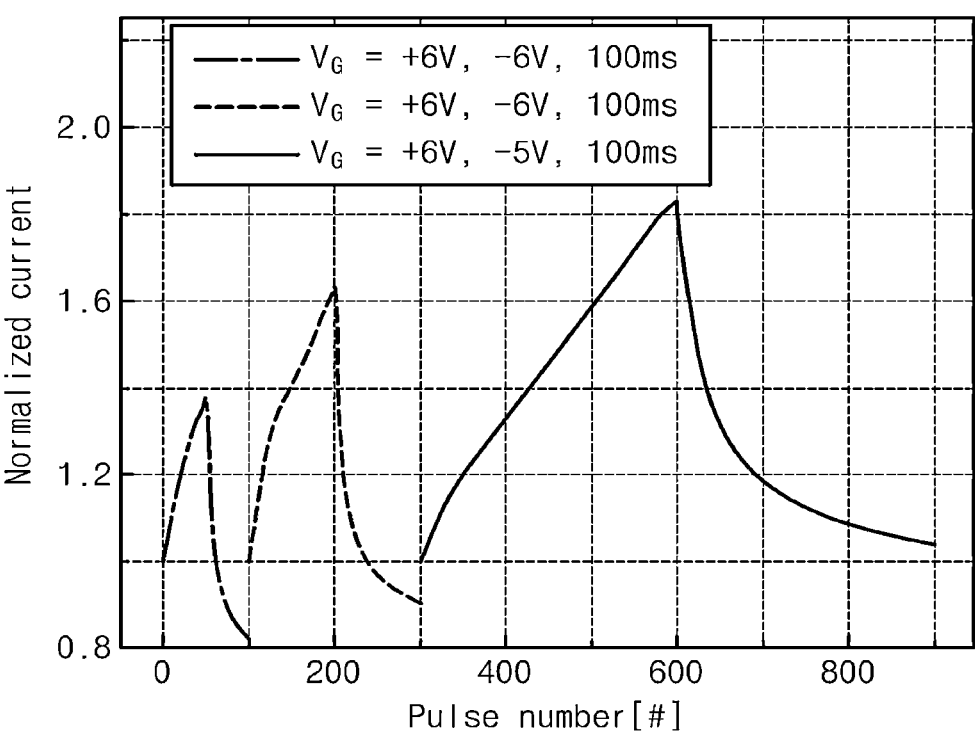
FIG. 9 is a graph depicting a change in a current according to application of pulses.
Figure 10:
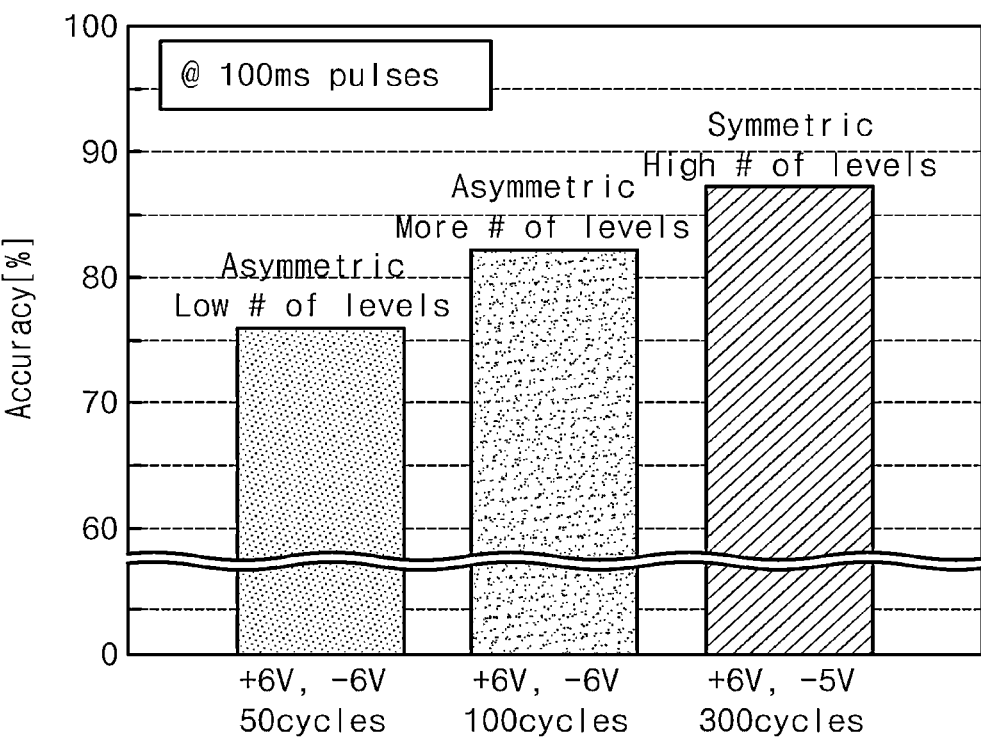
FIG. 10 is a graph depicting preciseness according to application of pulses.

FIG. 9 is a graph depicting a change of a current according to application of pulses, and FIG. 10 is a graph depicting a preciseness according to application of the pulses.

Referring to FIG. 9, it may be identified that an amount of currents that flow to the channel area normally increase and decreases when the number of pulses applied to the gate electrode 400 increases, and referring to FIG. 10, it may be seen that a high recognition rate of about 87% is secured even when the pulses are applied 300 times or more.

Figure 11:
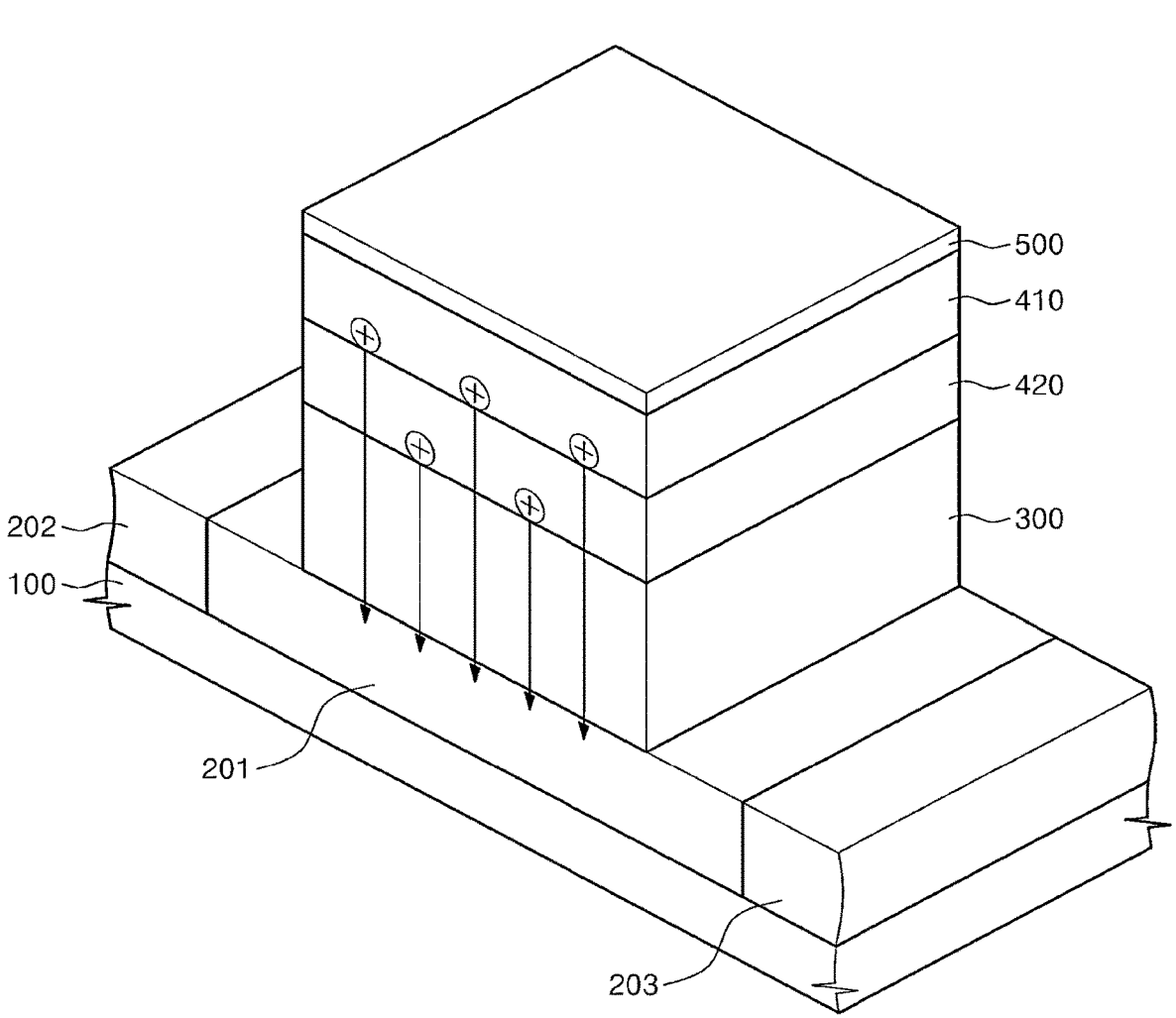
FIG. 11 is a view illustrating that a gate electrode 400 includes a first gate electrode 410 and a second gate electrode 420.
Figure 12:
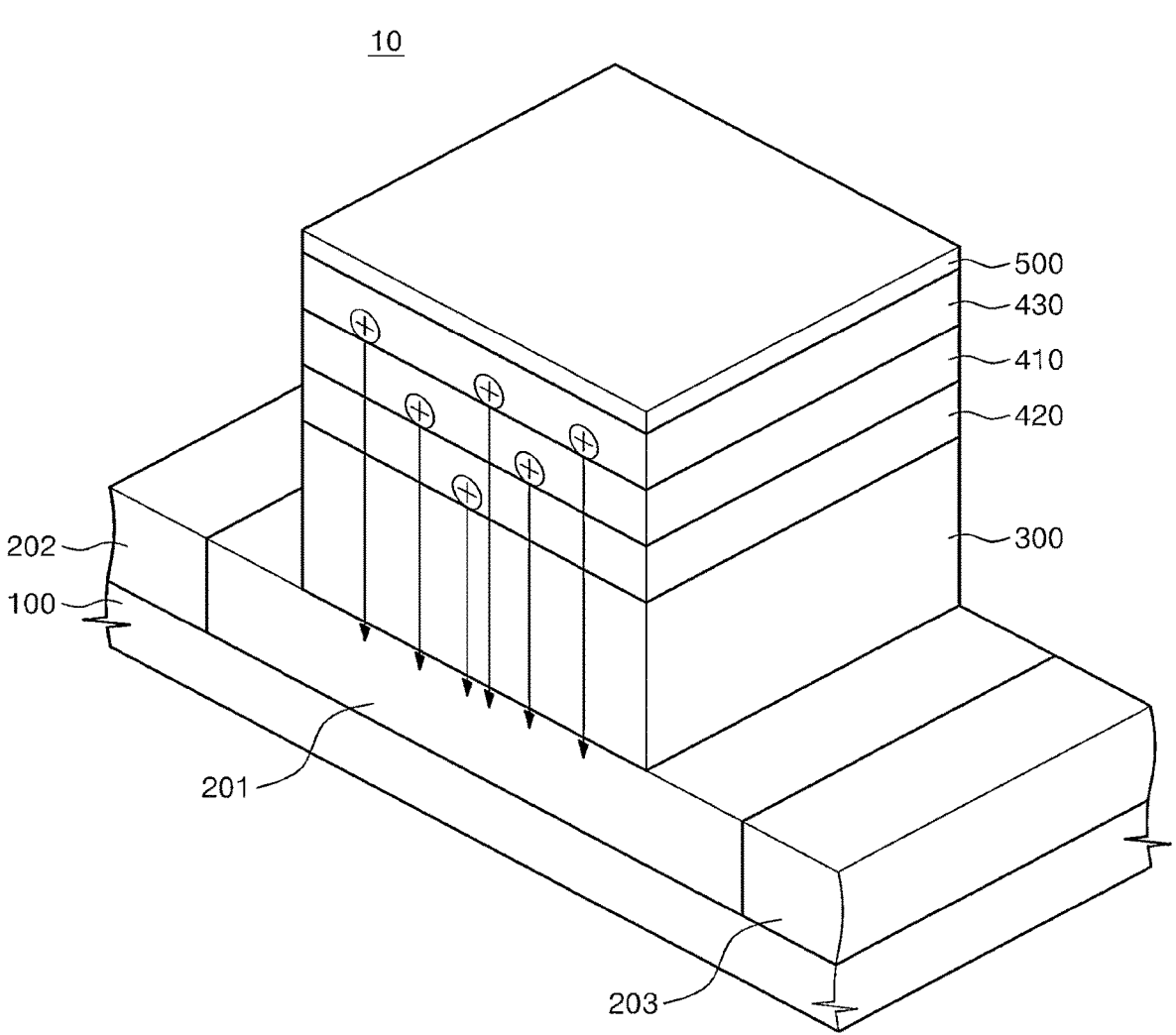
FIG. 12 is a view illustrating that a gate electrode 400 includes a first gate electrode 410, a second gate electrode 420, and a third gate electrode 430.

FIG. 11 is a view illustrating that the gate electrode 400 includes a first gate electrode 410 and a second gate electrode 420, and FIG. 12 is a view illustrating that the gate electrode 400 includes the first gate electrode 410, the second gate electrode 420, and a third gate electrode 430.

Referring to FIG. 11, the gate electrode 400 may include the second gate electrode 420 deposited while the ratio of argon and oxygen is 25:5 during the reactive sputtering, and the first gate electrode 410 deposited while the ratio of argon and oxygen is 27:3 after the second gate electrode 420 is deposited.

Furthermore, referring to FIG. 12, the gate electrode 400 may include the second gate electrode 420 deposited while the ratio of argon and oxygen is 25:5 during the reactive sputtering, the first gate electrode 410 deposited while the ratio of argon and oxygen is 27:3 after the second gate electrode 420 is deposited, and the third gate electrode 430 deposited while the ratio of argon and oxygen is 29:1 after the first gate electrode 410 is deposited.

As mentioned above in FIG. 2, when the ratio of the copper ions included in the gate electrode 400 is higher than the ratio of the oxygen ions, the copper ions are excessively laminated on the channel area 201 whereby it may not be easy to control a change in the conductance.

Accordingly, in the present disclosure, to solve the problem, the plurality of gate electrodes 410, 420, and 430 are provided as illustrated in FIG. 11 or FIG. 12, and a ratio of oxygen is increased in the gate electrode provided on a lower side thereof, and thus the copper ions may be prevented from being excessively laminated on the channel area 201 whereby the change in the conductance may be controlled more easily.

Figure 13:
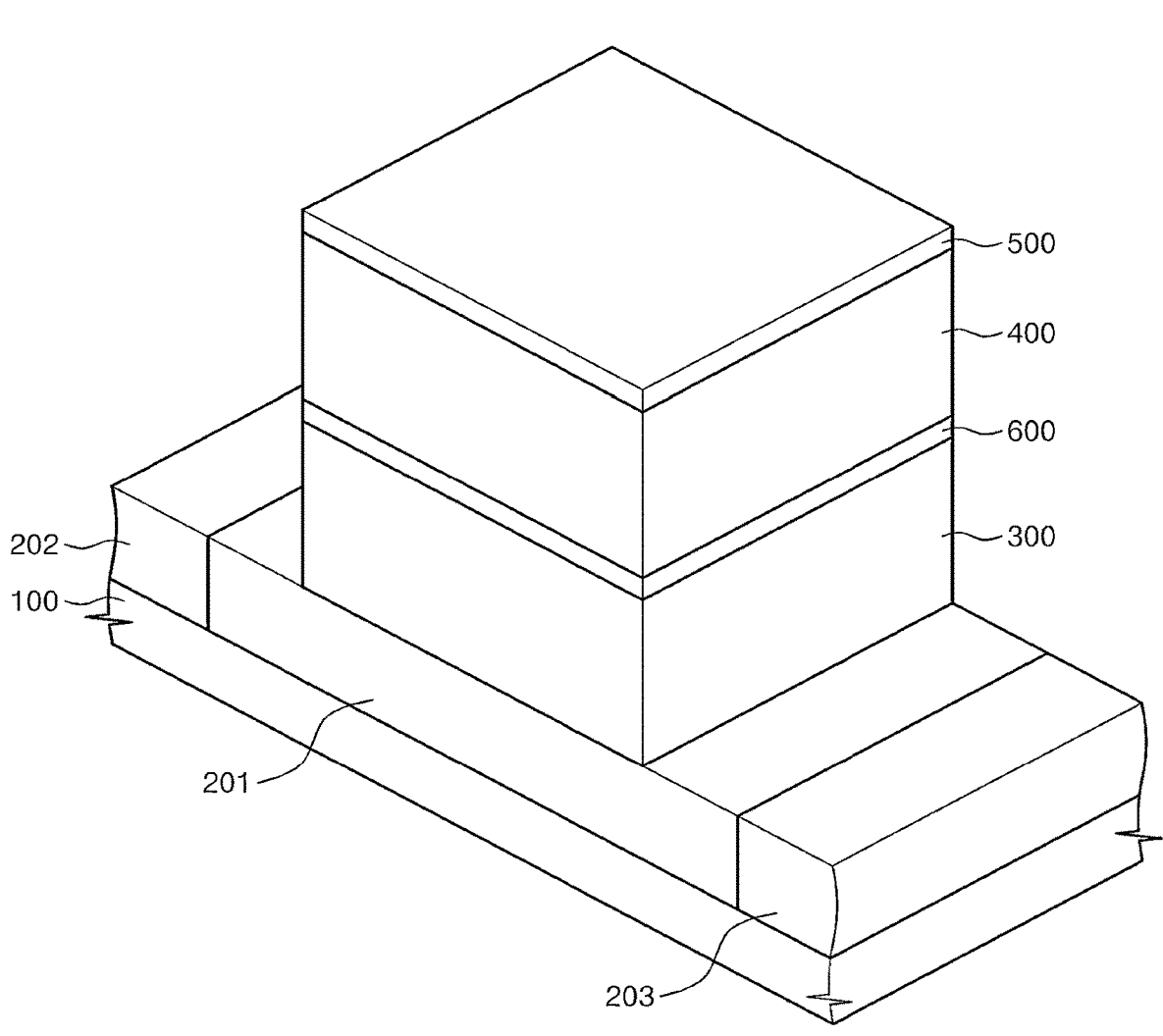
FIG. 13 is a view illustrating that a barrier layer 600 is added between a gate electrode 400 and an ion transport layer 300.

FIG. 13 is a view illustrating that a barrier layer 600 is added between the gate electrode 400 and the ion transport layer 300.

Referring to FIG. 13, the barrier layer 600 having a thickness of less than 5 [nm] including Ti, Ta, TiW, or TiN is added between the gate electrode 400 and the ion transport layer 300 and thus excessively many copper ions are laminated on the channel area 201 whereby a problem of the conductance not being changed may be solved.

Figure 14:
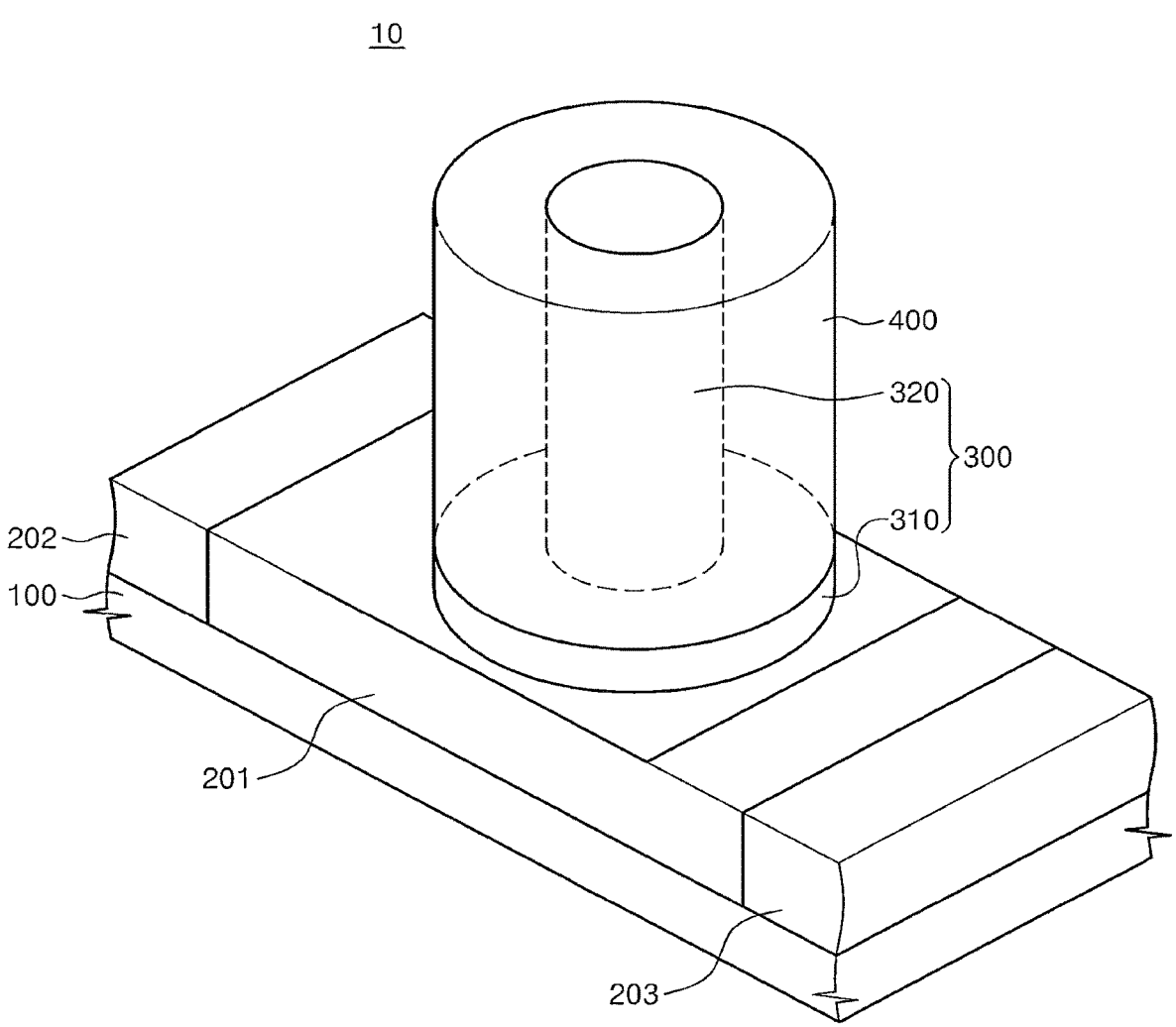
FIG. 14 is a view illustrating a first ion transport layer 300a located on a bottom surface of a gate electrode 400 and a second ion transport layer 300b surrounded by the gate electrode 400.

FIG. 14 is a view illustrating a first ion transport layer 300a located on a bottom surface of the gate electrode 400 and a second ion transport layer 300b surrounded by the gate electrode 400.

Referring to FIG. 14, the ion transport layer 300 may be provided with the second ion transport layer 320 having a shape surrounded by the gate electrode 400, together with the first ion transport layer 310 on a bottom surface of the gate electrode 400.

That is, the copper ions discharged from the gate electrode 400 in a vertical direction may be transported to the first ion transport layer 310, and the copper ions discharged from the gate electrode 400 in a horizontal direction may be transported to the second ion transport layer 320 whereby an amount of the copper ions discharged from the gate electrode 400 may be controlled through a change in the structure of the ion transport layer 300.

Referring back to FIG. 1, the $HfO_x$ that constitutes the ion transport layer 300 may be provided by other elements.

For example, the ion transport layer 300 may include $MoO_x$ instead of $HfO_x$ when the ratio of argon and oxygen is 29:1 during the reactive sputtering for generating the gate electrode 400, and the ion transport layer 300 may include $SiO_x$ instead of $HfO_x$ when the ratio of argon and oxygen is 25:5 during the reactive sputtering for generating the gate electrode 400.

That is, the element that constitutes the ion transport layer 300 may be provided differently according to a composition ratio of copper and oxygen that constitute the gate electrode 400.

According to the oxide electrode-based 3-terminal neuromorphic synaptic device and the method for manufacturing the same, a conductance of a device may be linearly controlled by adjusting a mass ratio of mobile ions in an oxide electrode containing mobile ions.

Meanwhile, the technical objectives that may be obtained in the present disclosure are not limited to the above-mentioned effects, and other effects may be clearly understood by an ordinary person in the art, to which the present disclosure pertains, from the following description.

The experiment of the present invention will be described in more detail below. In the experiment, a gradually modulated channel response was achieved in the Cu ion-driven ECRAM (electrochemical RAM) stack with a closed structure in which entire channel area is covered by an electrolyte and gate for avoiding postprocess difficulties. When the channel was fully covered by the pure Cu gate electrode in the closed structure, the ECRAM channel current became leaky and uncontrollable. To solve this problem, a CuOx oxide electrode was used as the gate to limit the number of mobile ion sources participating in switching. The gate has a lot of control over the restricted quantity of supplied ions, resulting in constantly changing synaptic characteristics.

Figure 15:
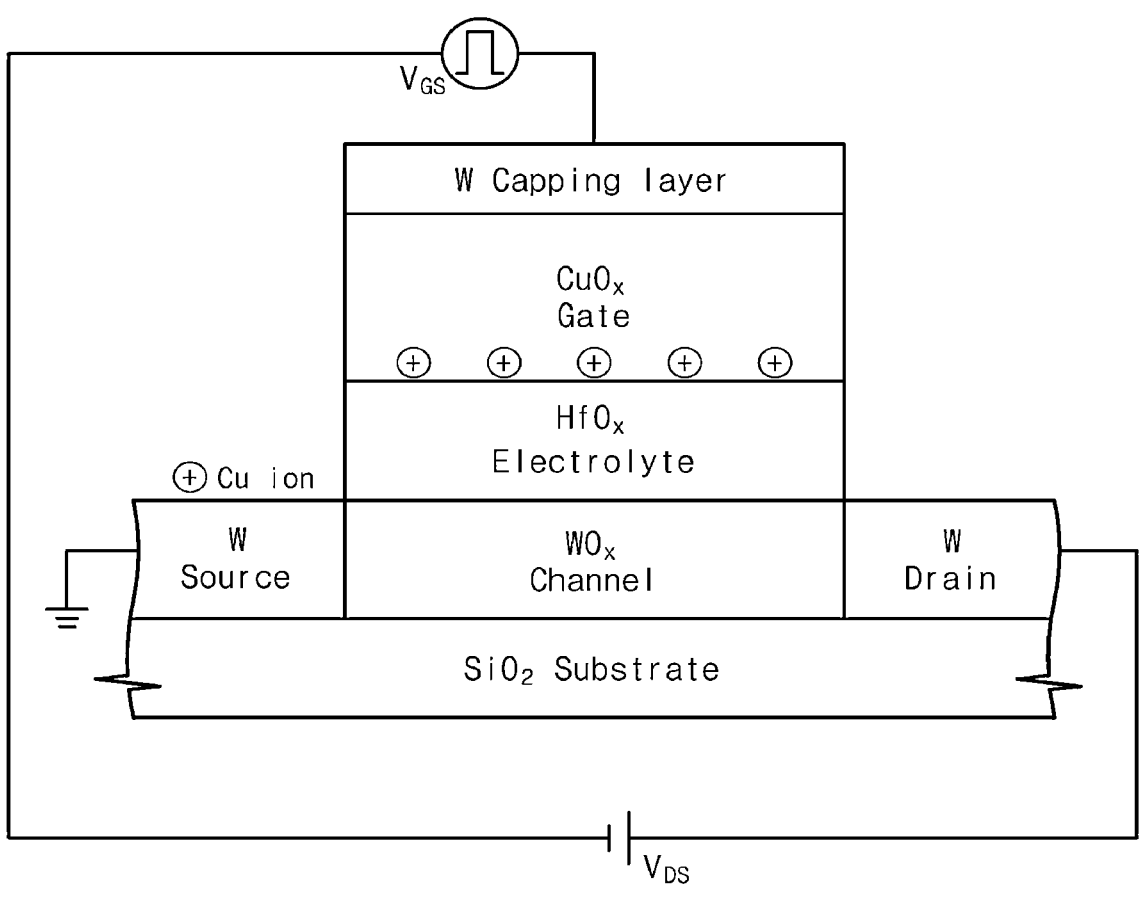
FIG. 15 is a schematic diagram of CuOx/HfOx/WOx ECRAM (electrochemical RAM) fabricated in the closed structure.

The ECRAM stacks were formed on a Si substrate with a thermally grown 100-nm-thick $SiO_2$ layer. Through photolithography and liftoff methods, a 20-nm-thick WOx layer for the channel was first deposited by RF sputtering at a power of 50 W in Ar plasma using a $WO_3$ metal-oxide target. Source and drain pads made of W metal were only defined on each side of the channel. Next, a sputter-deposited HfOx layer for the solid electrolyte was formed on top of the WOx channel area using a single HfOx target with an RF power of 100 W in Ar plasma. CuOx for the gate were formed by reactive sputtering on a Cu metal target using O gas and Ar gas simultaneously. To determine the impact of the composition, the gas flow rate for Ar (or O) was adjusted from 30 (or 0) to 25 (or 30) sccm. Finally, a thin W layer was deposited with a power of 50 W and a gas flow rate of 30 sccm using DC sputtering. The ECRAM devices were measured using the HP 4155B semiconductor parameter analyzer. The channel current between the source and drain was measured by applying a voltage to the drain while the source was grounded, whereas, to adjust the channel current, the identical pulses of the fixed voltage amplitude and width were repeatedly applied to the gate, and the source was still grounded, as shown in the schematic illustration in FIG. 15.

Figure 16:
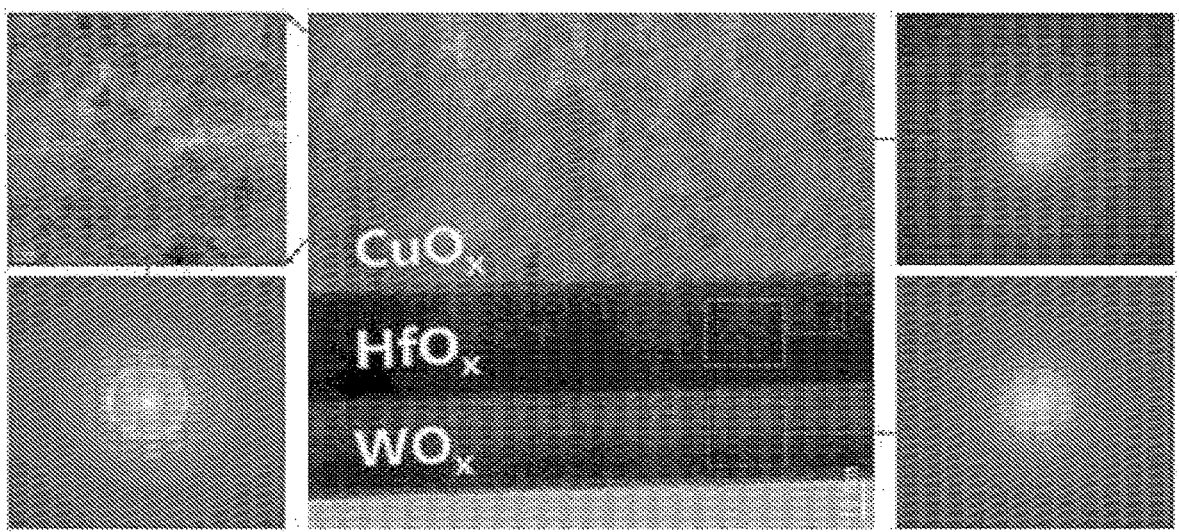
FIG. 16 is a TEM image showing a multilayer stack of the CuOx/HfOx/WOx ECRAM (electrochemical RAM) fabricated in the closed structure.
Figure 17:
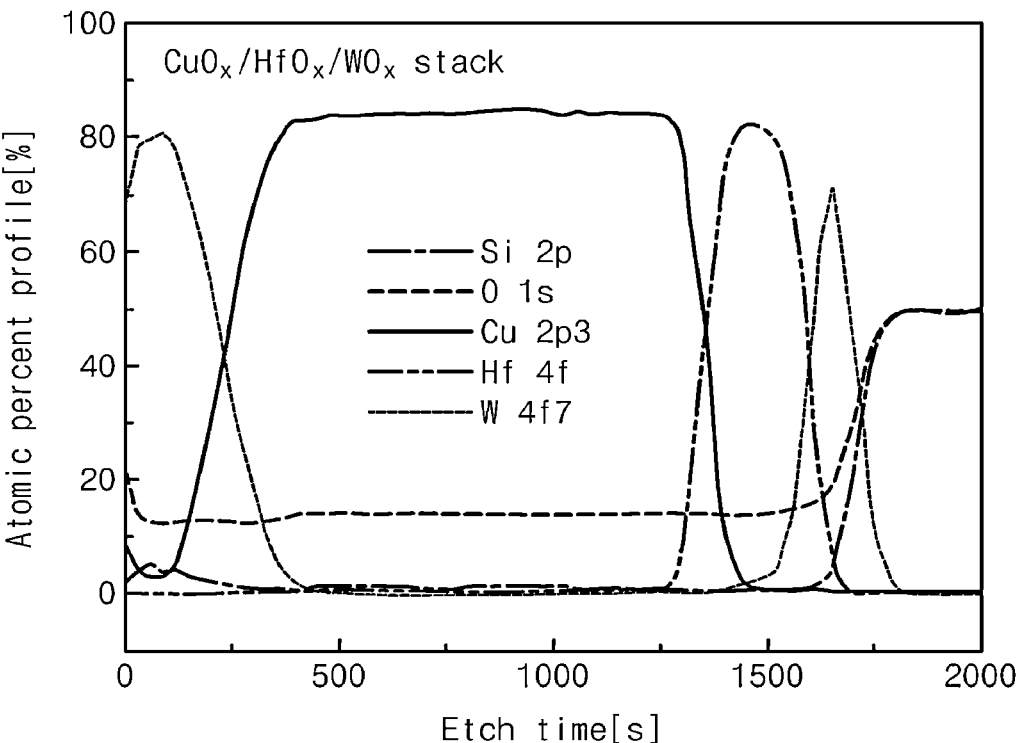
FIG. 17 is a XPS depth profiling of CuOx/HfOx/WOx ECRAM (electrochemical RAM) fabricated in the closed structure.

FIG. 16 shows the transmission electron microscopic (TEM) images of the fabricated ECRAM with the CuOx/ HfOx/WOx (from top to bottom) stack. As WOx and HfOx layers were deposited by tilted target sputtering at room temperature, both films showed amorphous phases obtained from fast Fourier transformation (FFT). Conversely, crystalline CuOx was clearly seen in the TEM and FFT images. O was uniformly distributed throughout the CuOx layer as concluded from x-ray photoelectron spectroscopy (XPS) depth profiling of FIG. 17. In the depth direction, as the atomic weight percentage of the Cu 2p3 peak representing the gate decreased, the Hf 4f and W 4f7 peaks were sequentially detected.

When 100×100 $um^2$-sized Cu/HfOx/WOx ECRAM was fabricated with the closed structure, large gate leakage through the HfOx electrolyte was measured, implying that considerable Cu ions were injected from the large-area Cu electrode as an infinite Cu ion reservoir. As a result, the CuOx oxide electrode was introduced to efficiently limit the quantity of mobile Cu ions approaching the channel. By altering the ratio of Ar and O gases during film deposition, the effect of CuOx composition on the synaptic function was evaluated. When a Cu-rich electrode with low O content (Ar:O ratio of 29:1) obtained by reactive sputtering was used for the gate, the high-channel current of about several hundred microamperes at the drain-source voltage ($V_{DS}$) of 0.5V was observed. Furthermore, the current erratically responded to gate-source voltage ($V_{GS}$) pulses of 6V with a width of 100 ms that were successively addressed. As observed in FIG. 2, this resulted in a substantial variance in the degree of channel conductance (G) that changed with each single pulse. Conversely, as the O gas ratio increased to 3 sccm, the channel current, lowered to tens of microamperes, consistently changed in a specific direction, resulting in an almost constant LG.

Figure 18:
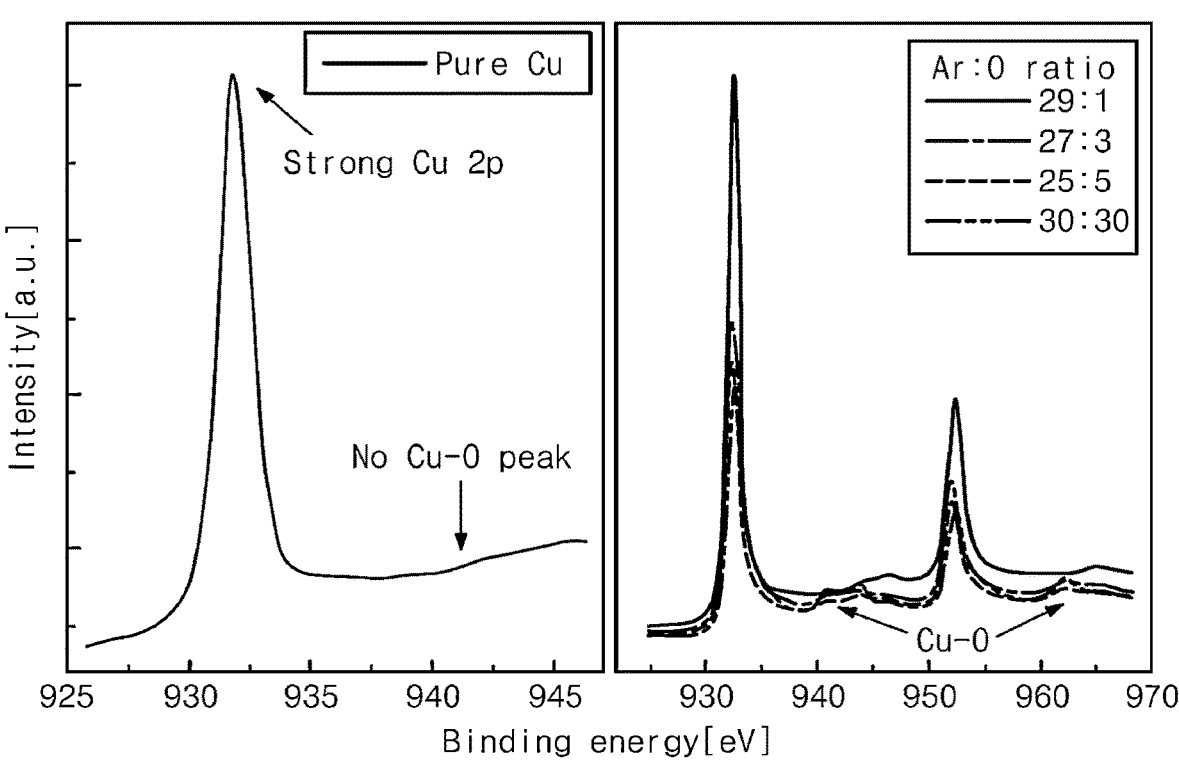
FIG. 18 shows Cu 2p peak intensities of the Cu and CuOx layers.
Figure 19:
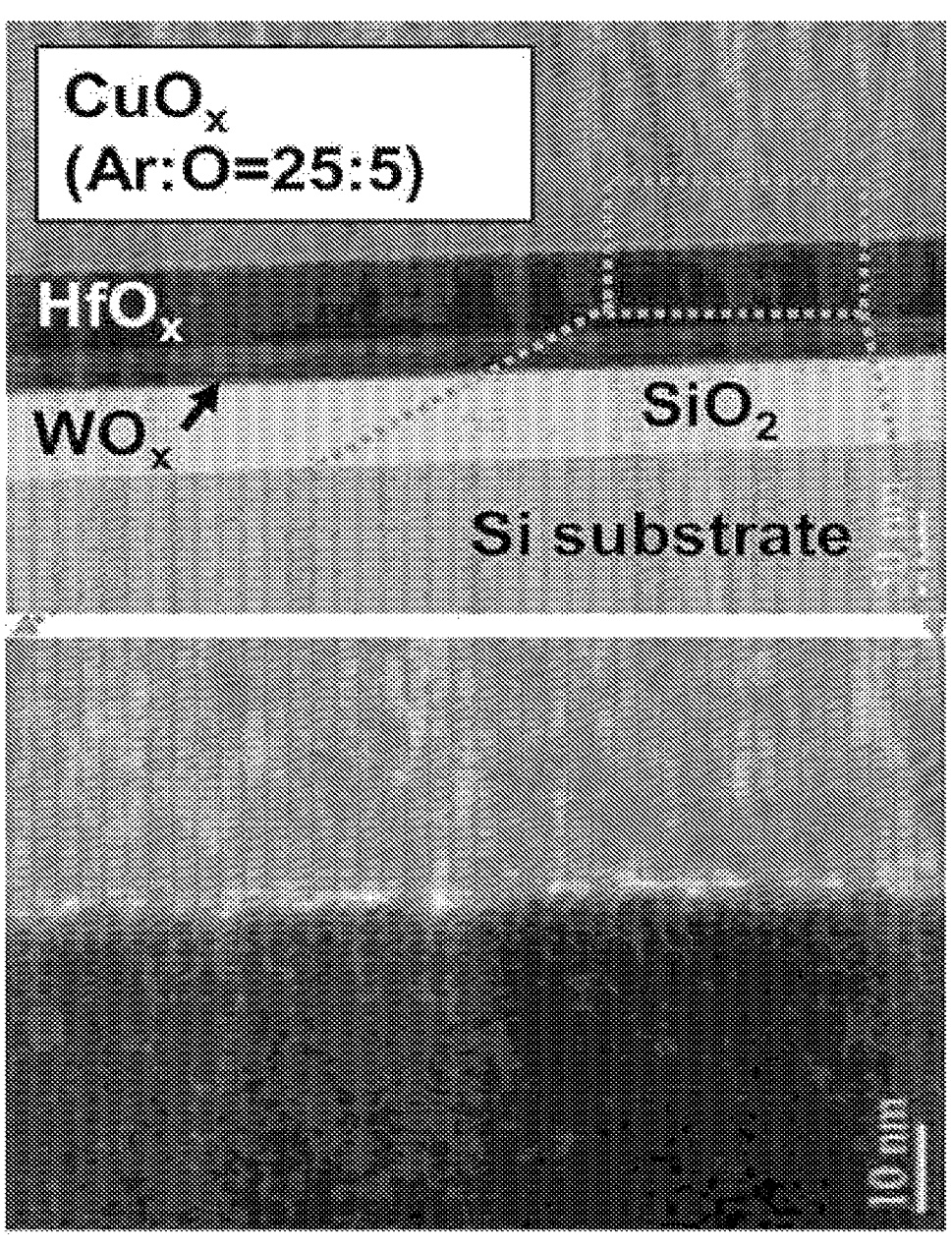
FIG. 19 is TEM images showing an extremely thin layer at the interface between the O-rich CuOx and HfOx layers, not observed in the Cu-rich CuOx and HfOx layers.
Figure 20:
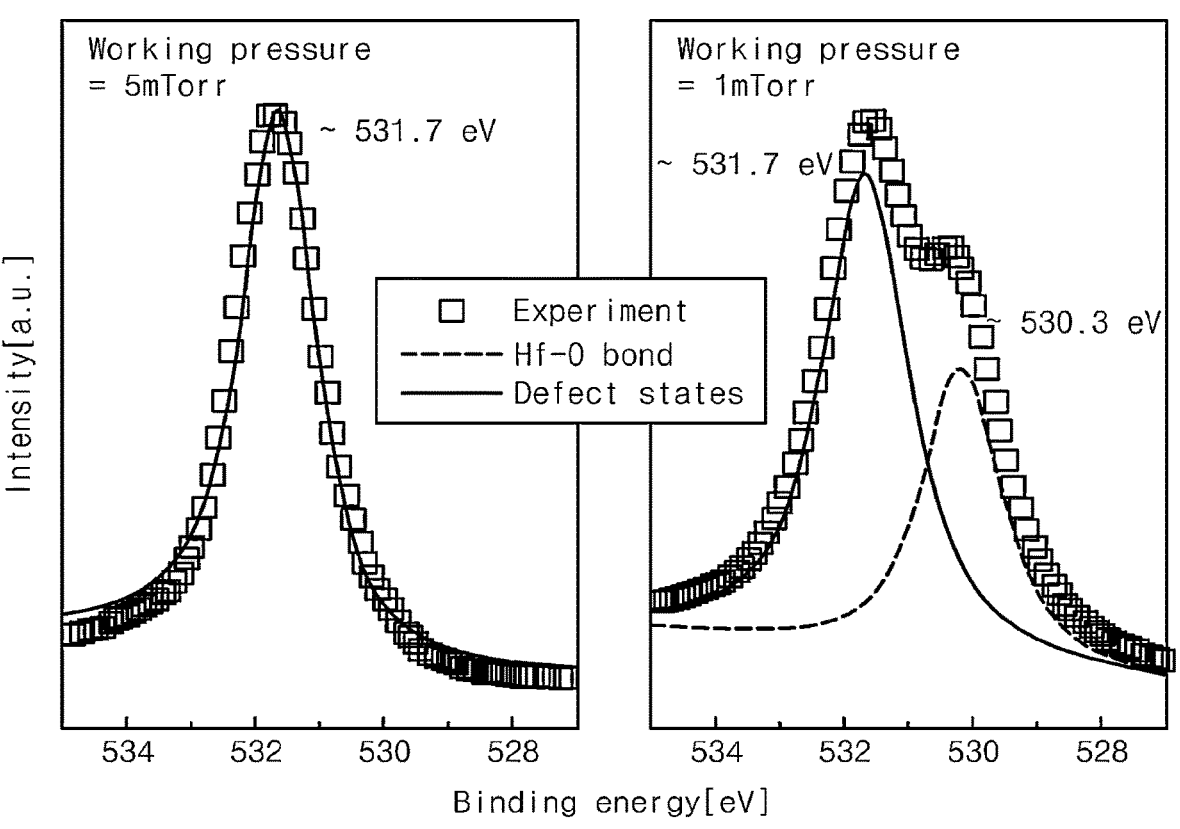
FIG. 20 shows O 1 s peak in the differently deposited HfOx layers.

However, no discernible change in ΔG was observed in the ECRAM with the O-rich CuOx gate generated by abundant O gas, as indicated at the bottom of FIG. 2 (an Ar:O ratio of 30:30). To understand the improved gate controllability, XPS spectra of Cu 2p were analyzed, as shown in FIG. 18. For the pure Cu electrode, a single peak representing metallic properties was solely observed at a binding energy of 933 eV. On adding the O gas for the CuOx layer formation, additional peaks corresponding to CuOx were detected at 943 and 962 eV. As the amount of O gas was increased, the peak intensities of metallic Cu and CuOx altered relatively to each other, indicating a chemical reaction between Cu and O and the creation of a CuOx layer deposited closer to CuO than Cu2O. Inferring from these results, the channel G in the ECRAM employing the optimal CuOx condition (Ar:O=27:3) is steadily modulated by the improved gate controllability by limiting ions participating in switching. Many Cu ions can be easily supplied into the electrolyte in the Cu-rich CuOx electrode, diminishing gate-induced ion migration. In contrast, most Cu ions were immobilized through chemical bonding with O in the O-rich CuOx electrode, making it difficult to supply sufficient sources for channel G modulation. Furthermore, an extremely thin interfacial layer was observed in the TEM images, wherein the O gas flow rate was higher than 5 sccm, as shown in FIG. 19. An additional chemical reaction likely occurred at the interface between O-rich CuOx and HfOx due to the larger O ion content of the O-rich CuOx. This thin layer could serve as a barrier preventing the Cu ion migration, which is another possible reason for the slight change in the channel current.

Examining the HfOx electrolyte characteristics that contribute to ion migration can be helpful to identify the necessity of delivering an appropriate number of Cu ions to accomplish synaptic behavior. For a given CuOx electrode made with an Ar:O ratio of 27:3, the normalized currents of the ECRAM devices with the same channel length and width of 100 um each responded more sensitively inverse to the HfOx thickness, resulting in a wider dynamic range, as shown in FIG. 6. However, as Cu ion injection was prevented by replacing the electrode with O-rich CuOx, the field-driven ion motion became weak, as shown in the right side of FIG. 6. Meanwhile, the ions must be effectively transported in the electrolyte. As shown in FIG. 5, the change in the channel current by the repeated gate pulses depended on the working pressure used for HfOx deposition. A thinner HfOx (32 nm) was formed at the fixed deposition time at a working pressure of 1 m Torr compared to a 40-nm-thick HfOx deposited at a higher working pressure of 5 m Torr, as confirmed via TEM analysis. Although the ion's travel distance was reduced in the ECRAM with a thinned HfOx layer, the channel current was rarely affected by the gate pulse. This is because the lower working pressure caused the formation of a dense HfOx film. In the O 1 s peak of both HfOx layers, a peak at 531 eV corresponding to oxygen vacancies due to the sputtering process was mainly observed. Only at the lower working pressure ambient, additional peak at 530 eV representing the Hf—O bond was observed, indicating that the ion migration was slowed by fewer defects in the HfOx film.

Figure 21:
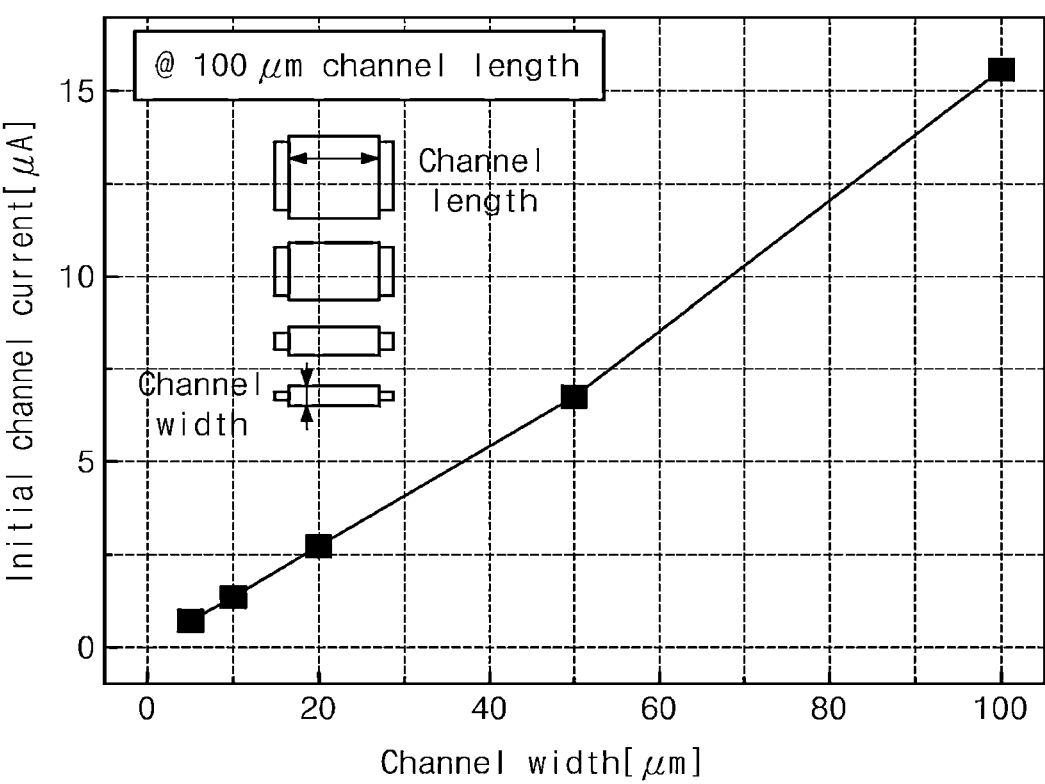
FIG. 21 shows that the initial channel current was linearly proportional to the size of the channel width.

Next, the synaptic properties in the optimal CuOx/HfOx/ WOx ECRAM with the channel length and width of 10 and 100 um were investigated, respectively. The channel G at $V_{DS}$ of 0.5V was gradually increased by the first 50 positive $V_{GS}$ pulses with a 6V amplitude and width of 100 ms, later smoothly decreased by the sequential $V_{GS}$ pulses of opposite polarity, as shown in FIG. 4. A plausible scenario is believed to be a redox reaction in the WOx channel. As the oxidized Cu ions from the electrode were migrated, the electrons converted the valence state of $W^{6+}$ to $W^{5+}$, increasing conductivity. The gate leakage current measured between the gate and source exhibited tens of nanoamperes at a $V_{GS}$ of 6V, thus excluding the local clustering of Cu ions to form filament observed in conventional RRAMs. This switching mechanism can be further identified indirectly through area scaling analysis, as shown in FIG. 21. When the channel length was scaled down to 4 um at a given channel width of 100 um, the analog synaptic behaviors were still observed; however, the initial channel current was linearly changed proportional to the length. This is because the area of the channel involved in switching by the gate-induced Cu ions reduced. Either larger voltages or longer pulse widths allowed more Cu ions to be moved, resulting in a wider dynamic range of the G at $V_{DS}$ of 0.5V of the 100×100 um²-sized ECRAM, as shown in FIGS. 7 and 8.

Figure 22:
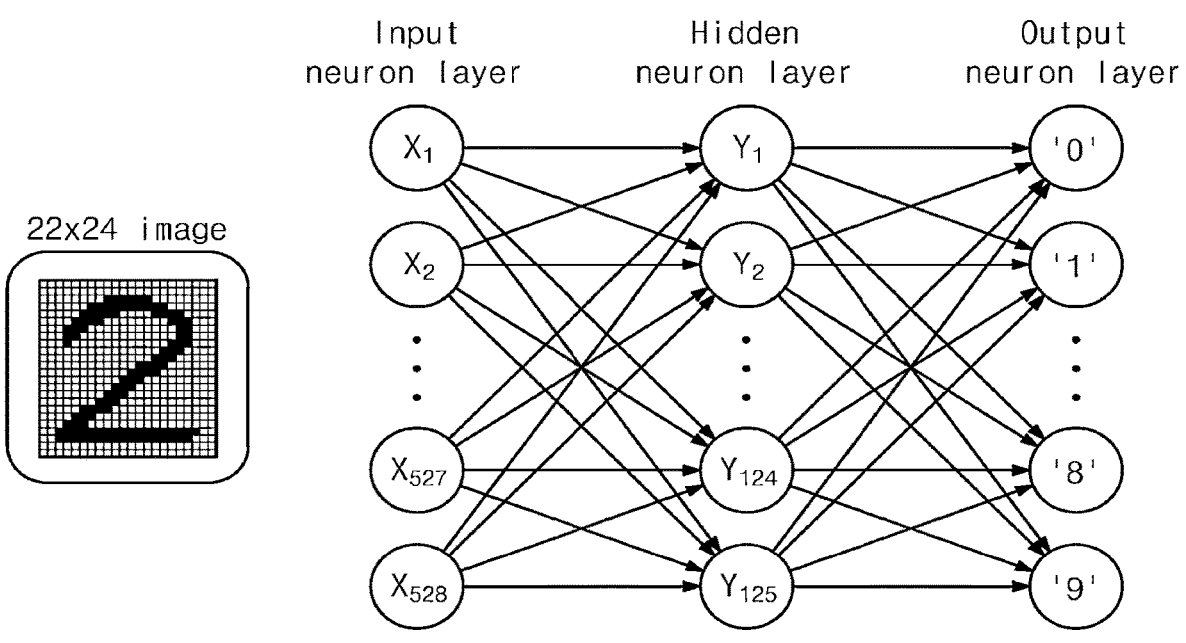
FIG. 22 is a schematic diagram of an artificial neural network based on the three-layer perceptron.
Figure 23:
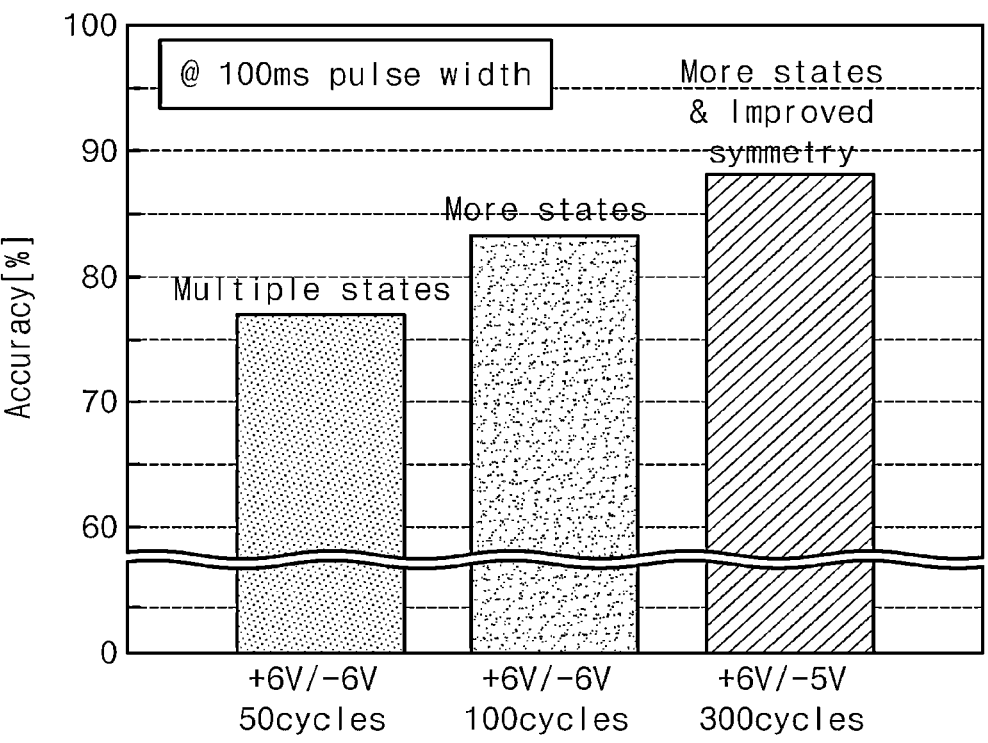
FIG. 23 shows an improved accuracy of the present invention.

Finally, the pattern recognition accuracy was evaluated by building a neural network in MATLAB simulation, wherein the developed ECRAMs were assumed as the synapse. The three-layer perceptron based on a backpropagation algorithm consisting of 528 input neurons was constructed to classify the 22×24 pixel images. Ten output neurons from "0" to "9" were used for the handwritten dataset through 125 hidden layers, as shown in FIG. 22. Simulation results showed that the gradually tuned currents of the ECRAM enabled a test accuracy of greater than 77%, as shown in FIGS. 9 and 23, which can further improve by increasing the multilevel states determined by the number of applied $V_{GS}$ pulses. As the ECRAM channel state continued to change without saturation even after 100 repeated $V_{GS}$ pulses, an accuracy of 82% was achieved. The identical gate pulse condition for both positive and negative directions led to a larger current reduction, as shown in FIG. 9. The asymmetric gate voltage pair (+6 V/−5 V) with more pulses, i.e., 300 was utilized, showing a higher accuracy of 88%. Furthermore, it was further investigated whether ECRAM-based synapses could be trained to accurately recognize images using only a certain neural network algorithm environment with learning rates, epochs, and neural network sizes of 0.1, 20, and 528-125-10, respectively. Appropriate algorithm conditions for the synaptic behavior of ECRAM can contribute to achieving higher accuracy.

An analogous channel behavior in the mobile ion source-constrained CuOx/HfOx/WOx ECRAM for neuromorphic synaptic elements was demonstrated by the experiments described above. More specifically, limiting the number of mobile Cu ions toward the WOx channel is important to ensure gate controllability. As a result, the CuOx gate formed by the reactive sputtering process was utilized, investigating the impact of CuOx composition on the synaptic behavior. The results showed that Cu-rich CuOx provided many Cu ions, resulting in a larger channel current of hundreds of microamperes with the current being insensitive to the gate pulse. Conversely, no distinct current modulation was observed in O-rich CuOx consisting of a stronger Cu—O bonding, implying that few ions were involved in the channel. Hence, in the optimum CuOx condition, the steadily tuned channel current was accomplished by continually applying hundreds of identical gate pulses when the adequately supplied Cu ions efficiently migrated across the defective HfOx electrolyte. The area-dependent synaptic characteristic was also related to the driving forces such as voltage amplitude and pulse width promoting the ion migration. Finally, it was shown that the three-layer neural network constructed with the ECRAM-based analog synapses can accurately recognize the handwritten digits through simulations previously described.

Although the present disclosure has been described through the embodiments, the above embodiments are provided only for describing the spirit of the present disclosure and the present disclosure is not limited thereto. It will be understood that an ordinary person may apply various modifications to the above-described embodiments. A scope of the present disclosure is determined only through construction of the attached claims.

What is claimed is:

1. A 3-terminal neuromorphic synaptic device comprising:
   a substrate;
   a source electrode and a drain electrode provided on the substrate to be spaced apart from each other;
   a channel area provided on the substrate to be electrically connected to the source electrode and the drain electrode, between the source electrode and the drain electrode;
   an ion transport layer provided on the channel area;
   a gate electrode provided on the ion transport layer, the gate electrode including a hollow cylinder; and
   a voltage application part configured to apply a gate voltage to the gate electrode,
   wherein the gate electrode is formed of at least one of an oxide-based material including mobile ions, a chalcogenide-based material including the mobile ions, and a nitride-based material including the mobile ions,
   wherein the ion transport layer includes:
      a first cylinder on which the hollow cylinder is provided; and
      a second cylinder provided on the first cylinder and surrounded by the hollow cylinder, a diameter of the second cylinder being less than a diameter of the first cylinder,
   wherein an outer diameter of the hollow cylinder is equal to the diameter of the first cylinder,
   wherein a height of the hollow cylinder is equal to a height of the second cylinder.

2. The 3-terminal neuromorphic synaptic device of claim 1, wherein the mobile ions are copper ions, and a mass ratio of the copper ions in the gate electrode is more than 84.2% and less than 93.7%.

3. The 3-terminal neuromorphic synaptic device of claim 1, wherein the ion transport layer has a thickness of more than 20 nanometers and less than 30 nanometers.

4. The 3-terminal neuromorphic synaptic device of claim 1, wherein the gate electrode includes:
   a second gate electrode laminated on the ion transport layer; and
   a first gate electrode laminated on the second gate electrode, and
   wherein a mass ratio of the mobile ions included in the first gate electrode is higher than a mass ratio of the mobile ions included in the second gate electrode.

5. The 3-terminal neuromorphic synaptic device of claim 4, wherein the gate electrode further includes:

a third gate electrode laminated on the first gate electrode, and wherein a mass ratio of the mobile ions included in the third gate electrode is higher than the mass ratio of the mobile ions included in the first gate electrode.

6. The 3-terminal neuromorphic synaptic device of claim 1, wherein a barrier layer is provided between the ion transport layer and the gate electrode, and wherein the barrier layer includes Ti, Ta, TiW, or TiN.

\* \* \* \* \*